(12) United States Patent
Schrader et al.

(10) Patent No.: US 8,726,976 B2
(45) Date of Patent: May 20, 2014

(54) LAMINATED SHEET MANIFOLD FOR MICROCHANNEL HEAT EXCHANGER

(75) Inventors: Timothy J. Schrader, Irwin, OH (US); Ian G. Spearing, Westerville, OH (US)

(73) Assignee: Liebert Corporation, Columbus, OH (US)

( * ) Notice: Subject to any disclaimer, the term of this patent is extended or adjusted under 35 U.S.C. 154(b) by 1237 days.

(21) Appl. No.: 12/388,102

(22) Filed: Feb. 18, 2009

(65) Prior Publication Data

US 2009/0211743 A1    Aug. 27, 2009

Related U.S. Application Data

(60) Provisional application No. 61/030,600, filed on Feb. 22, 2008.

(51) Int. Cl.
| | | |
|---|---|---|
| *F28F 9/02* | (2006.01) | |
| *B29C 67/00* | (2006.01) | |
| *F28D 1/047* | (2006.01) | |
| *F28D 1/053* | (2006.01) | |

(52) U.S. Cl.
CPC ............. *F28F 9/0221* (2013.01); *F28D 1/0476* (2013.01); *F28D 1/0478* (2013.01); *F28D 1/05375* (2013.01); *F28D 1/05383* (2013.01); *F28D 1/05391* (2013.01); *F28F 2255/00* (2013.01); *F28F 2255/12* (2013.01); *B29C 67/0051* (2013.01)
USPC ........ 165/140; 165/175; 165/174; 29/890.052

(58) Field of Classification Search
USPC .......................................... 165/140, 148, 174
See application file for complete search history.

(56) References Cited

U.S. PATENT DOCUMENTS

| | | | |
|---|---|---|---|
| 4,516,632 A |   | 5/1985 | Swift et al. |
| 5,016,707 A |   | 5/1991 | Nguyen |
| 5,186,243 A | * | 2/1993 | Halstead ........................ 165/135 |
| 5,205,347 A | * | 4/1993 | Hughes .......................... 165/176 |
| 5,209,285 A | * | 5/1993 | Joshi ............................... 165/41 |
| 5,241,839 A | * | 9/1993 | Hughes ........................... 62/515 |
| 5,242,016 A | * | 9/1993 | Voss et al. ..................... 165/174 |
| 5,295,532 A | * | 3/1994 | Hughes ........................... 165/76 |
| 5,727,618 A |   | 3/1998 | Mundinger et al. |
| 5,836,383 A |   | 11/1998 | Zwittig |
| 6,192,596 B1 |   | 2/2001 | Bennett et al. |
| 6,490,812 B1 |   | 12/2002 | Bennett et al. |
| 6,537,506 B1 |   | 3/2003 | Schwalbe et al. |
| 6,622,519 B1 |   | 9/2003 | Mathias et al. |

(Continued)

FOREIGN PATENT DOCUMENTS

| | | |
|---|---|---|
| JP | 05-079654 | 3/1993 |
| JP | 04-225961 | 12/2004 |
| JP | 06-292223 | 10/2006 |

*Primary Examiner* — Allen Flanigan
(74) *Attorney, Agent, or Firm* — Locke Lord LLP

(57) ABSTRACT

A heat exchanger can have a manifold which includes a plurality of laminated sheets that allow a customization of the heat exchanger. The design can allow for a more optimal flow of coolant to areas of high load, thereby making the temperature distribution across the heat exchanger more uniform, or intentionally non-uniform. Furthermore, the laminated sheets can allow multiple circuits to be employed in the heat exchanger such that different coolants can be utilized therein and maintained separate from one another. The tubes can be microchannel tubes. A single set of manifolds can be used with multiple heat exchanger cores to provide a more compact heat exchanger. Mounting features can be integral with a group of the sheets.

26 Claims, 22 Drawing Sheets

(56) References Cited

U.S. PATENT DOCUMENTS

| | | |
|---|---|---|
| 6,643,302 B1 | 11/2003 | Nishikawa et al. |
| 6,705,392 B2 * | 3/2004 | Gotou et al. ............ 165/140 |
| 6,827,139 B2 * | 12/2004 | Kawakubo et al. ........ 165/173 |
| 6,892,805 B1 * | 5/2005 | Valensa ................. 165/174 |
| 7,000,427 B2 | 2/2006 | Mathias et al. |
| 7,014,835 B2 | 3/2006 | Mathias et al. |
| 7,056,477 B1 | 6/2006 | Schwalbe et al. |
| 7,118,920 B2 | 10/2006 | Brophy et al. |
| 7,241,423 B2 | 7/2007 | Golbig et al. |
| 7,637,314 B2 * | 12/2009 | Park et al. ............. 165/174 |
| 7,650,935 B2 * | 1/2010 | Demuth et al. .......... 165/176 |
| 2005/0039901 A1 * | 2/2005 | Demuth et al. .......... 165/175 |
| 2005/0087767 A1 | 4/2005 | Fitzgerald et al. |
| 2005/0284621 A1 * | 12/2005 | Katoh et al. ........... 165/174 |
| 2008/0017364 A1 * | 1/2008 | Ichiyanagi et al. ...... 165/178 |

* cited by examiner

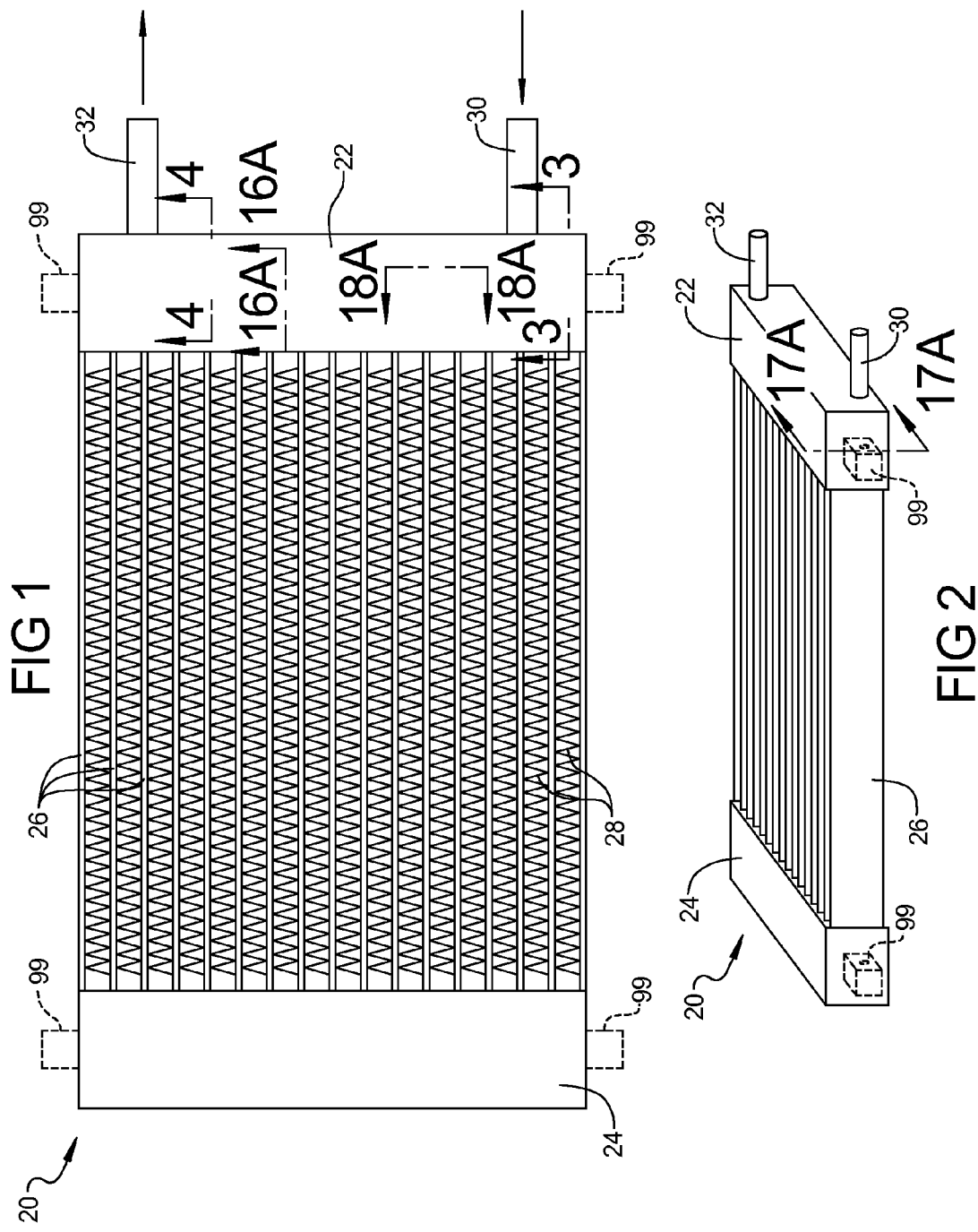

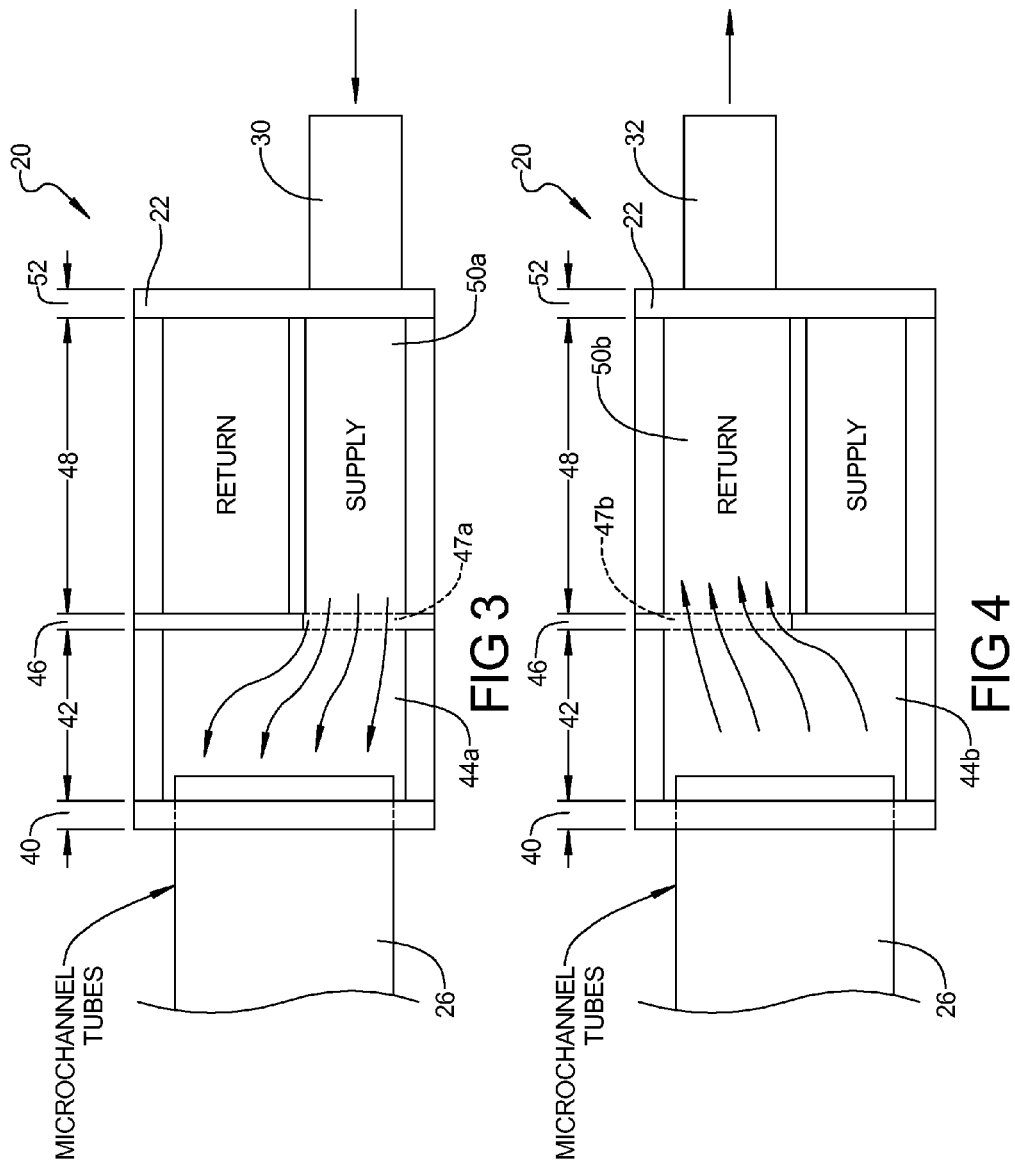

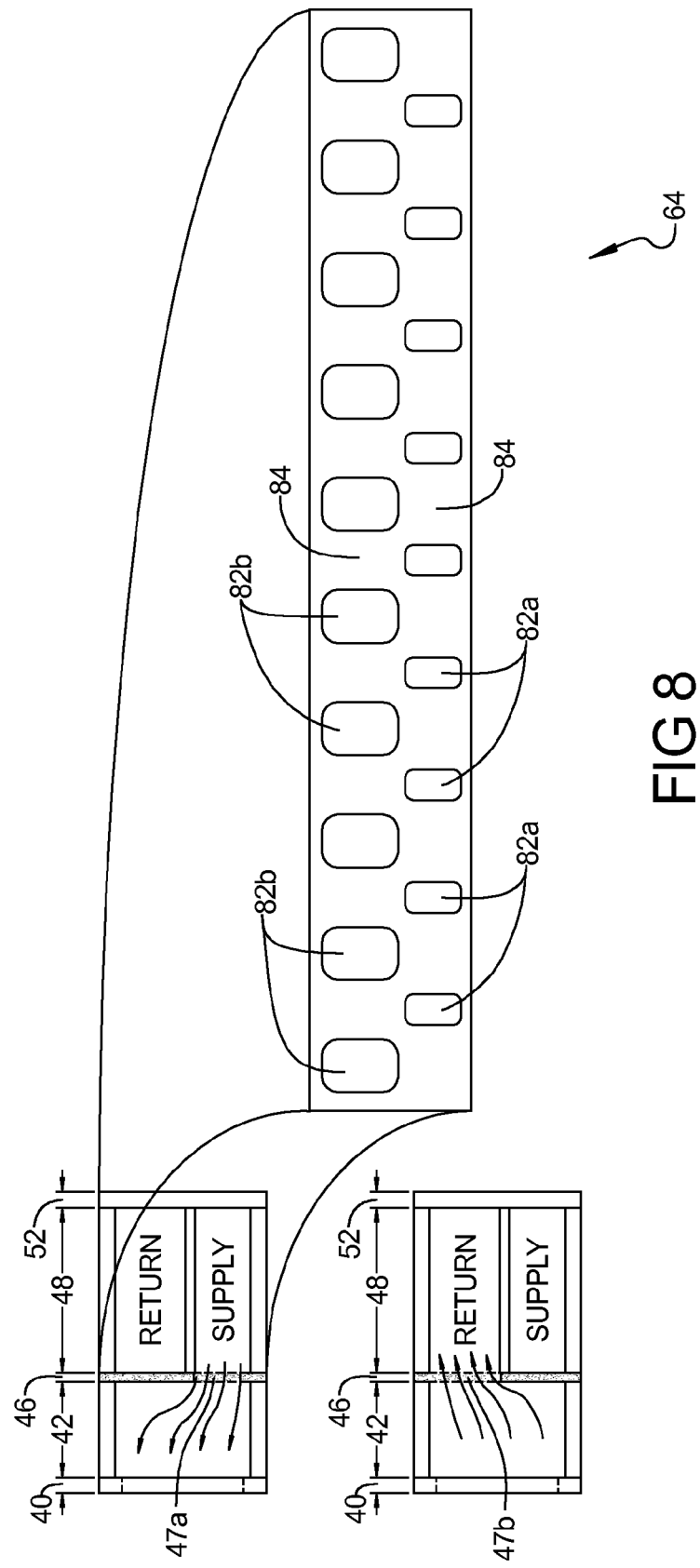

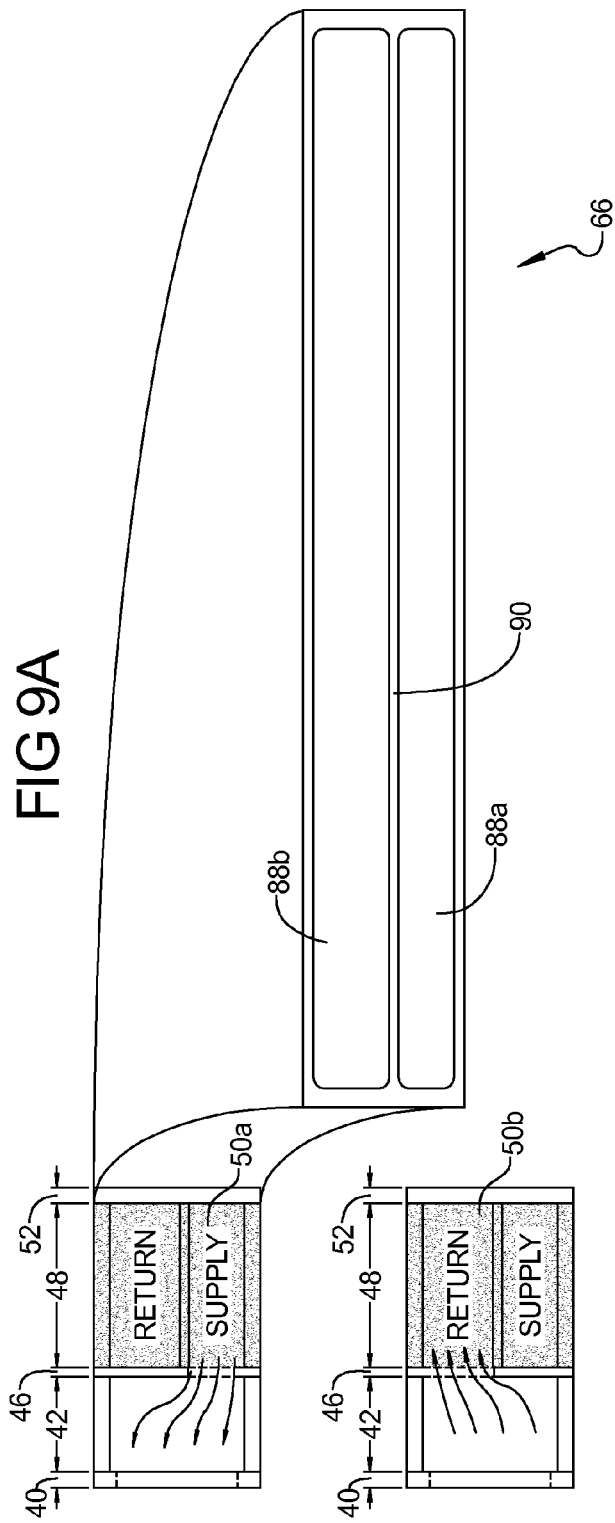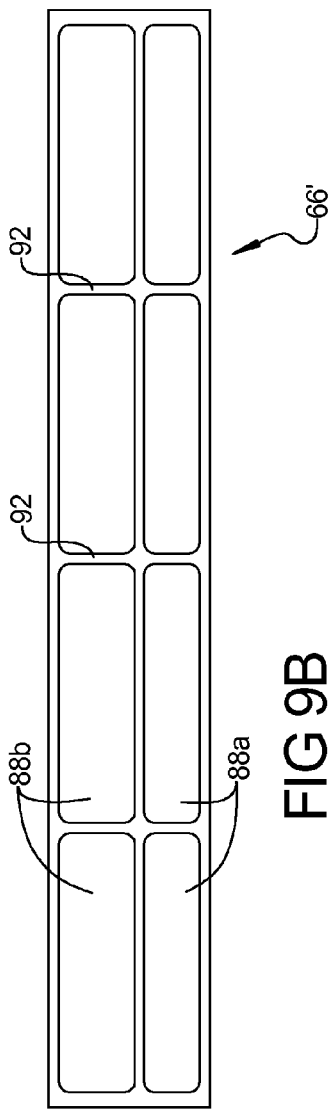

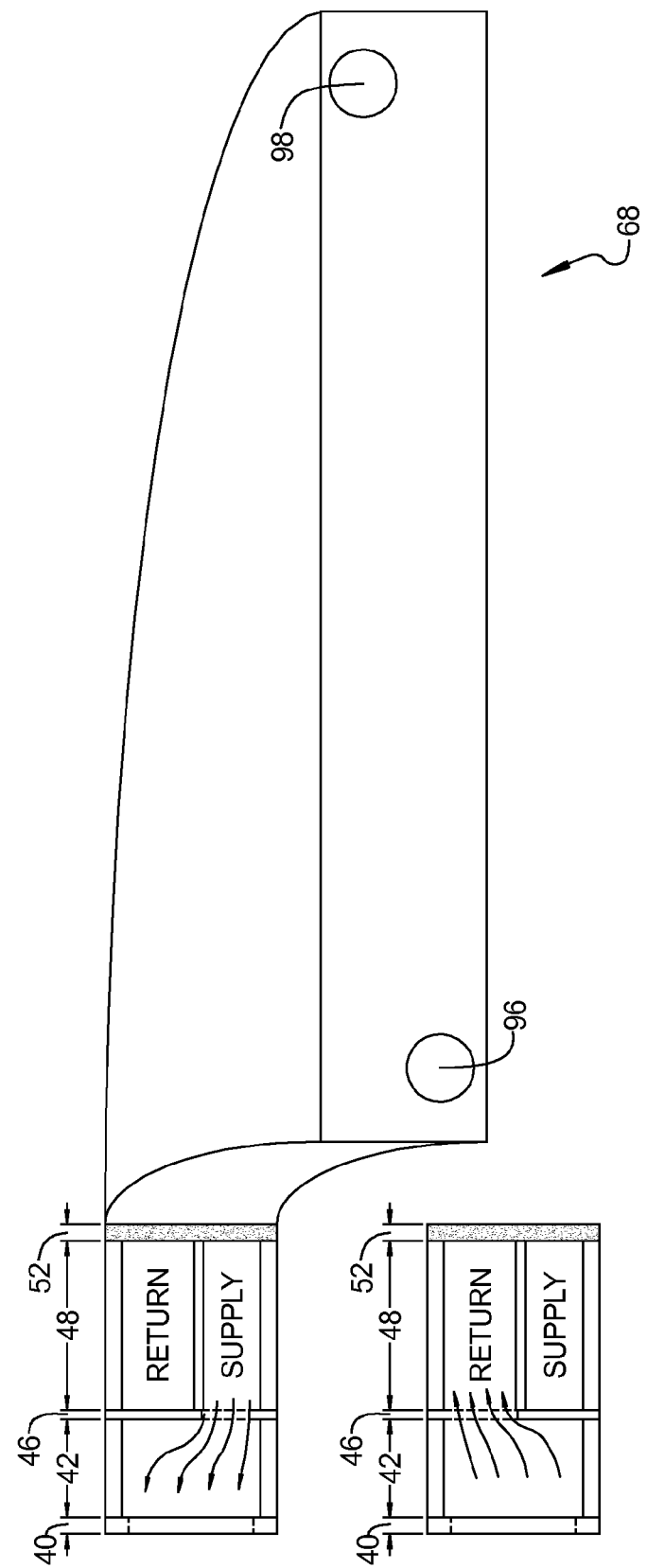

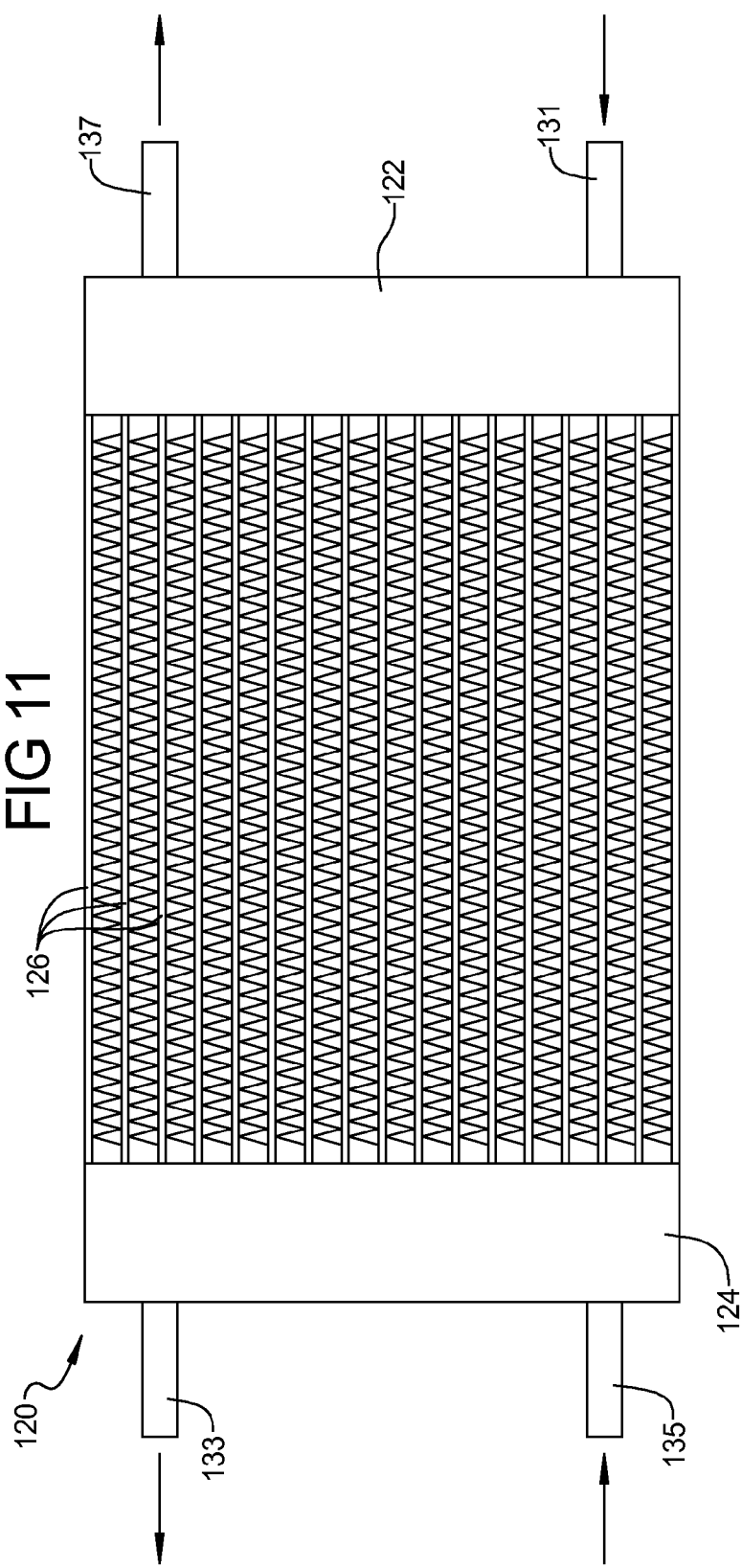

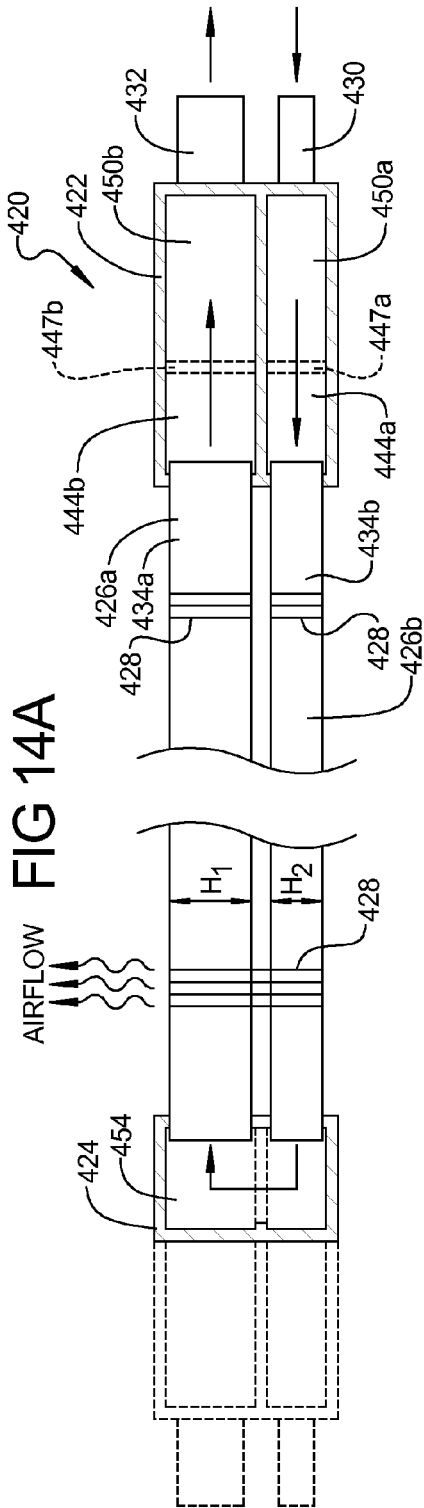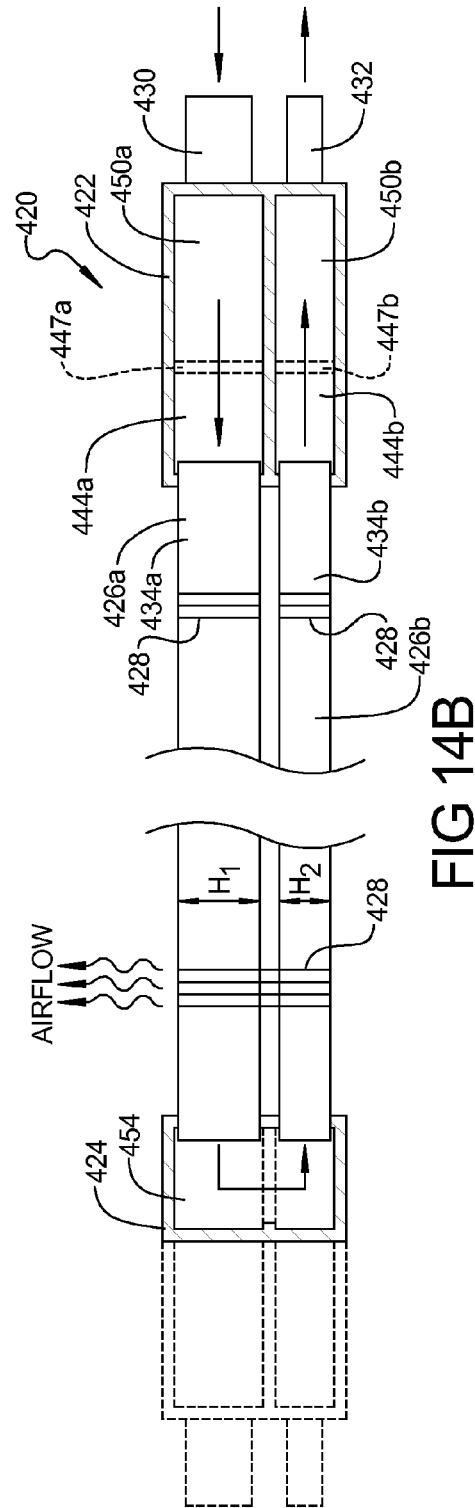

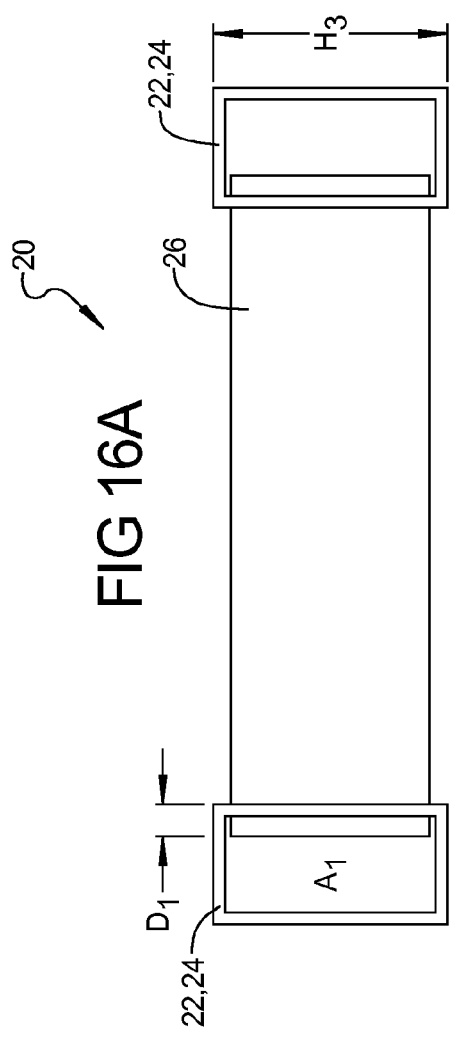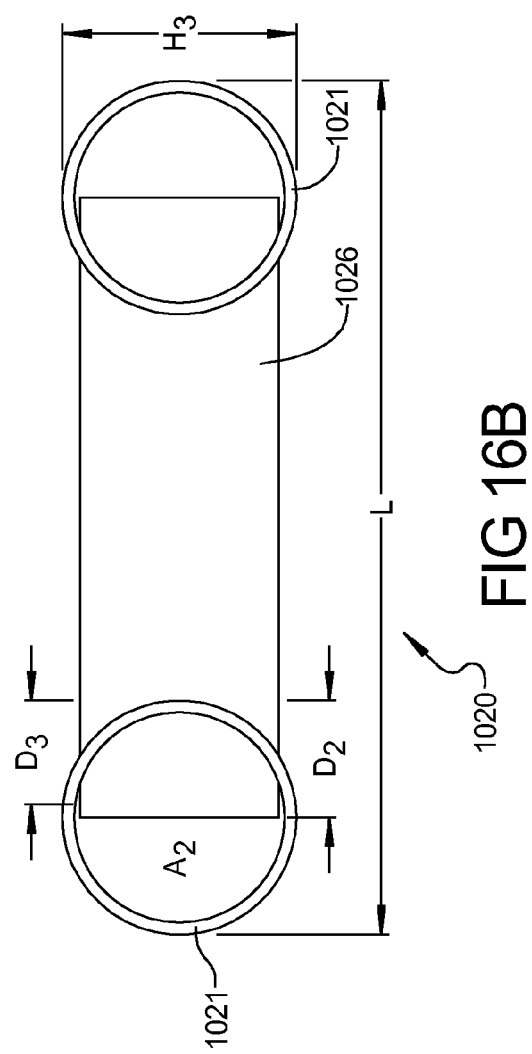

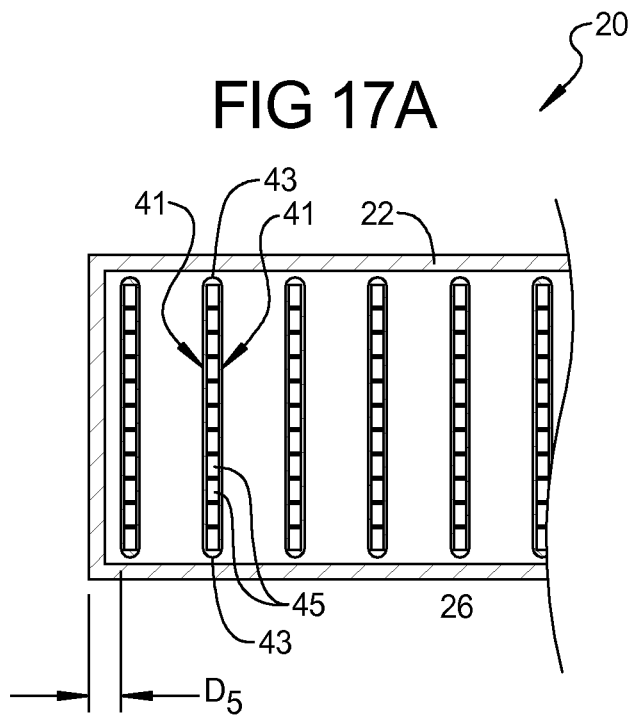
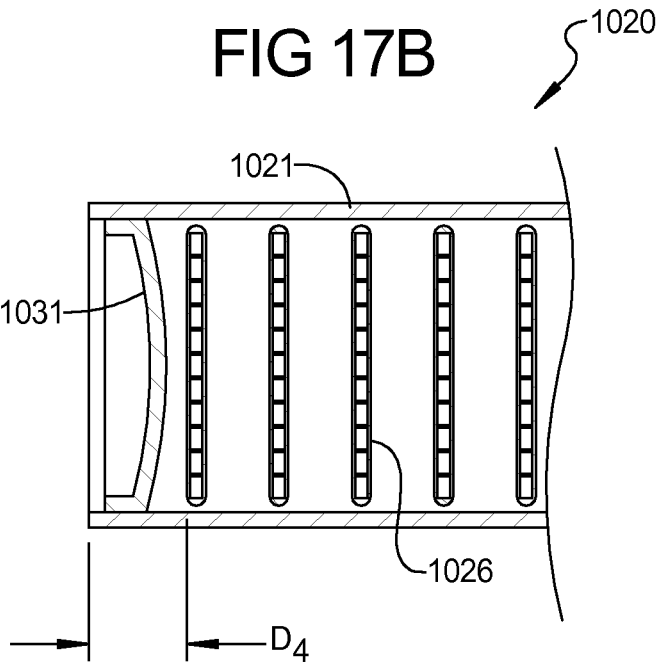

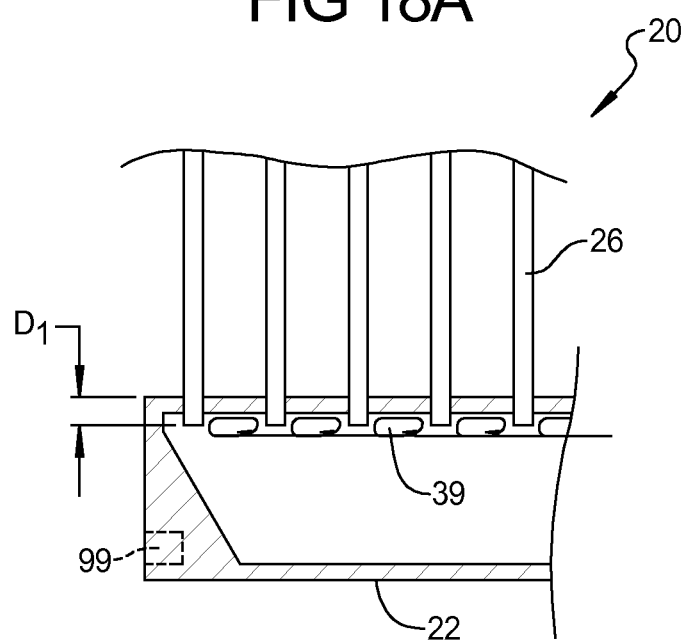
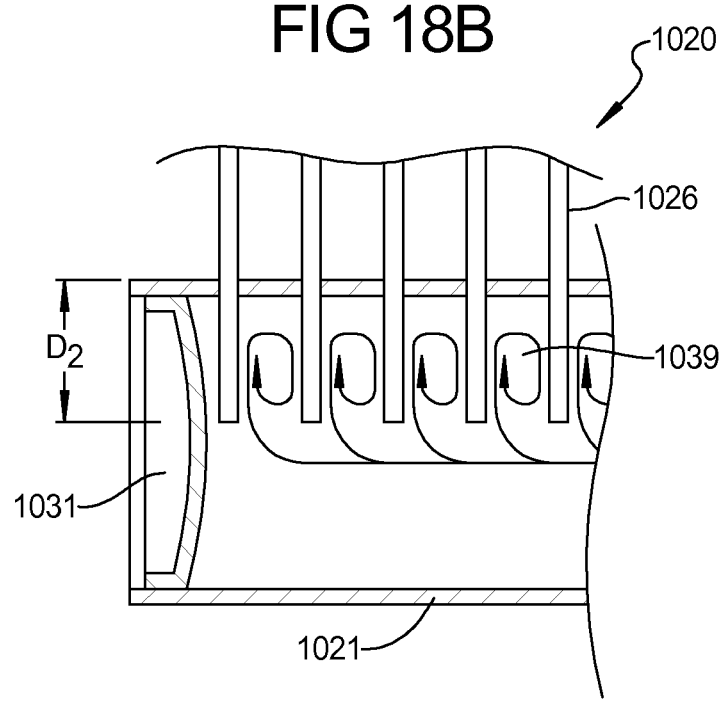

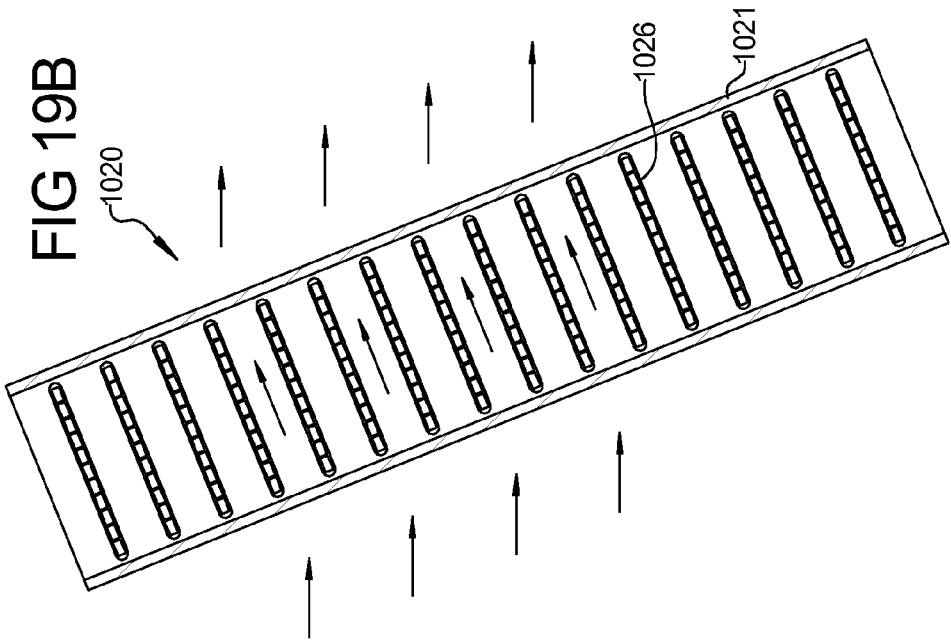
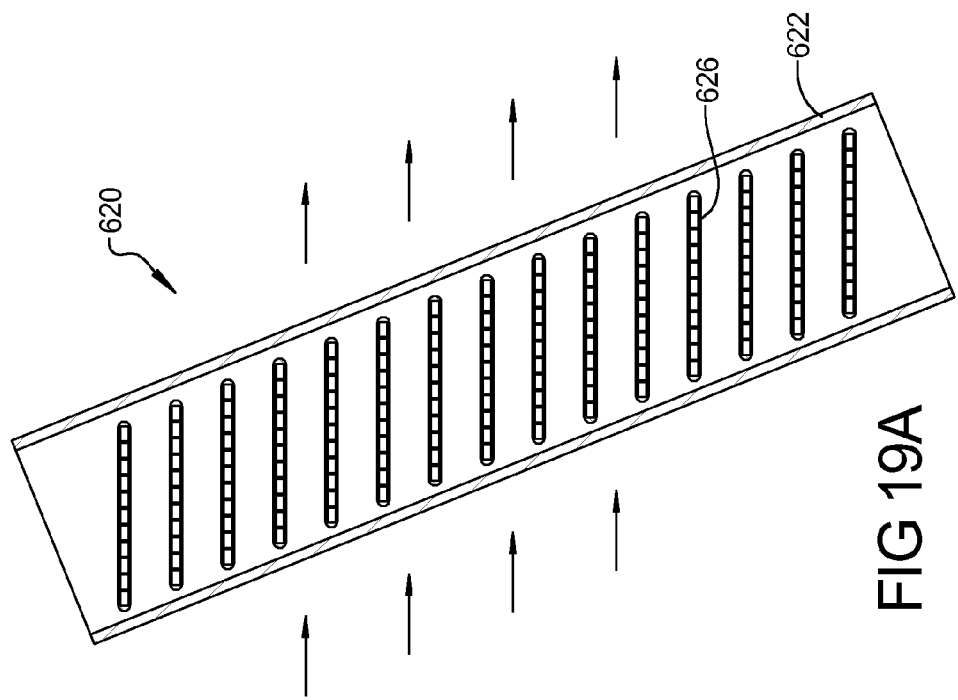

LAMINATED SHEET MANIFOLD FOR MICROCHANNEL HEAT EXCHANGER

CROSS-REFERENCE TO RELATED APPLICATION

This application claims the benefit of U.S. Provisional Application No. 61/030,600, filed on Feb. 22, 2008. The entire disclosure of the above application is incorporated herein by reference.

FIELD

The present invention relates to heat exchangers and, more particularly, to laminated sheet manifolds for microchannel heat exchangers.

BACKGROUND AND SUMMARY

The statements in this section merely provide background and summary information related to the present teachings and may not constitute prior art.

Microchannel heat exchangers can be used to transfer heat between a fluid, such as air, flowing outside of the heat exchanger and a fluid, such as a coolant, flowing through the heat exchanger. One such application is in the use of computer/electronic equipment. As the power density of computer/electronic equipment increases, it becomes favorable to position cooling components, such as heat exchangers, as close to the heat source as possible. In air-cooling applications, this might mean positioning the air-to-coolant heat exchanger in the computer rack between card chassis as an "intercooler." When the heat exchanger is so close to the heat source, however, hot spots on the electronic equipment can cause a non-uniform temperature distribution, in any coordinate direction, across the heat exchanger.

The typical microchannel heat exchanger design is a one-pass configuration wherein the coolant flows in the same direction in all of the tubes. Generally, there is some amount of overfeed so that the coolant does not change phase completely to vapor, but in areas of high load (hot spots), it is possible that the coolant in some tubes changes phase to vapor only. Beyond the point at which the coolant changes phase, heat is transferred through the tube to the vapor phase only. In any vapor-phase-only regions, there is a greater rise in temperature per unit heat transfer compared to liquid-phase or two-phase regions. Due to the coolant flow in only one direction in current one-pass heat exchangers, these vapor-phase-only regions experience a rapid rise in temperature from thermal loads becoming hot spots in the coil. The hot spots in the coil limit the ability to accept further thermal load, thus creating hot spots in the exterior airflow to be cooled, and further creating hot spots in the electronics in the downstream airflow path.

In high-pressure applications, the manifold is typically circular or round piping with slots cut therein to receive the microchannel tubing. The use of round piping, however, can require that the microchannel tubing intrudes into the cavity within the round piping a significant amount. The degree to which the microchannel tubing extends into the cavity in the round piping impedes flow along the round piping. Additionally, the large intrusion can limit the useful heat exchange area of a heat exchanger so formed when confined within a limited space. As a result, less heat transfer may be realized due to the reduced heat exchange area and/or the obstructions to the flow within the manifold.

Additionally, with the round pipe manifolds, an end cap is typically inserted into the cavity of the round pipe at the end thereof. The end cap protrudes into the inner cavity, thereby further limiting the space available for the attachment of microchannel tubing. As a result, the available area for heat exchange is reduced and/or the size of the manifold is increased.

In some applications, it may be desirable to provide redundant heat exchangers in the event that if one fails the other is available. The use of multiple heat exchangers can consume a significant amount of space which may be limited in the application in which the heat exchangers are utilized. The multiple heat exchangers each include their own manifolds to route the cooling fluid therethrough. The use of the separate manifolds increases the size of the heat exchangers, thereby increasing the required space to fit the two heat exchangers into a given area for the application.

In some applications, it may be desired to have the heat exchanger extend at an angle relative to the airflow. In the typical heat exchangers with the round piping manifolds, however, the microchannel tubing is arranged perpendicular to the piping axis due to the difficulty associated with the forming of insertion slots in anything but a perpendicular direction. As a result, the airflow across the heat exchanger may be required to change direction at least once, thereby increasing the airside pressure drop. The increased airside pressure drop may reduce the effectiveness of the heat exchanger or increase the fan or blower power required to maintain the desired airflow rate through the heat exchanger.

The typical heat exchangers may have limited capability for the inclusion of mounting features thereon that allow the heat exchanger to be mounted in a desired position. The use of the round piping manifold provides limited options for the inclusion of attachment features. Thus, a typical heat exchanger may be difficult to mount in a desired position and/or have increased assembly steps or costs associated with providing mounting features thereon.

A microchannel heat exchanger according to the present disclosure can have a manifold which includes a plurality of laminated sheets. The sheets can allow a customization of the heat exchanger by allowing the laminated sheets to define the direction of coolant flow for each individual tube. The design can allow for a more optimal flow of coolant to areas of high load, thereby making the temperature distribution across the heat exchanger more uniform, or intentionally non-uniform. Furthermore, the laminated sheets can allow multiple circuits to be employed in the heat exchanger such that different coolants can be utilized therein and maintained separate from one another.

A heat exchanger according to the present teachings can include a plurality of tubes having opposite first and second ends with at least one flow path extending therebetween. The tubes can be adjacent one another. A plurality of fins can be in heat-transferring relation with the tubes. A first manifold is in fluid communication with the first ends of the tubes. A second manifold can be in fluid communication with the second ends of the tubes. Each manifold includes a plurality of sheets having one or more openings therethrough. The sheets are laminated together with the openings in each of the sheets aligned with openings in other ones of the sheets to form flow passageways through the manifolds that are in fluid communication with the at least one flow path in the tubes. The flow passageways allow a fluid to flow between the first manifold, a first group of the tubes, and the second manifold.

In some embodiments, the heat exchanger utilizes only a single manifold. Both of the ends of the tubes extend from the single manifold such that flow therethrough originates from and returns to the single manifold.

In some embodiments, the tubes are microchannel tubes that intrude into the manifolds only a limited distance. The limited intrusion can increase the heat transfer area for a confined packaging space or provide a given heat transfer area in a reduced space. The intrusion can advantageously be limited by one or more projections in the openings of a group of the sheets.

In some embodiments, the first and second manifolds form flow passageways with two heat exchanger cores. The two manifolds can supply a single fluid flow through both cores or separate fluid flows through each core that do not intermix. The use of a single set of manifolds to provide flow passageways with two cores can provide a more compact heat exchanger utilizing multiple cores. The use of multiple cores may also facilitate the use of the heat exchanger as an evaporator or condenser and the sizes of the tubes in the cores can be designed to accommodate single-phase and multi-phase flow.

In some embodiments, mounting features can be integral with a group of the sheets. The integral mounting features can facilitate the mounting of the heat exchanger in a desired location.

In some embodiments, the openings in the sheets are of differing sizes to provide flow restrictions. The flow restrictions may be designed to provide differing flow rates through differing tubes or to provide a substantially uniform flow rate through the tubes.

Further areas of applicability will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

FIG. 1 is a plan view of a microchannel heat exchanger utilizing a laminate sheet manifold according to the present teachings;

FIG. 2 is a perspective view of the heat exchanger of FIG. 1;

FIG. 3 is a fragmented cross-sectional view along line 3-3 of FIG. 1;

FIG. 4 is a fragmented cross-sectional view along line 4-4 of FIG. 1;

FIG. 8 is a plan view of an exemplary sheet used in the third section of the manifold of FIG. 1;

FIGS. 9A and 9B are plan views of exemplary sheets used in the fourth section of the manifold of FIG. 1;

FIG. 10 is a plan view of an exemplary sheet used in the fifth section of the manifold of FIG. 1;

FIG. 11 is a plan view of another heat exchanger utilizing laminated sheet manifolds according to the present teachings to separate circuits;

FIG. 14A is a cross-sectional view of laminated sheet manifolds according to the present teachings coupling two separate heat exchanger cores together to provide an evaporator;

FIG. 14B is a cross-sectional view of laminated sheet manifolds according to the present teachings coupling two separate heat exchanger cores together to provide a condenser;

FIGS. 16A and 16B are cross-sectional views along lines 16A-16A and 16B-16B of FIGS. 1 and 20, showing the intrusion of the microchannel tubing into a laminated sheet manifold according to present teachings and a round piping manifold according to the prior art, respectively;

FIGS. 17A and 17B are cross-sectional views along lines 17A-17A and 17B-17B of the heat exchangers of FIGS. 2 and 20, respectively, illustrating the lost space in the prior art heat exchangers;

FIGS. 18A and 18B are fragmented cross-sectional views along lines 18A-18A and 18B-18B of the heat exchangers of FIGS. 1 and 20, respectively, illustrating the difference in the dead zones within the manifolds;

FIGS. 19A and 19B are comparisons of a tilted heat exchanger utilizing a laminated sheet manifold according to the present teachings and a prior art round piping manifold, respectively;

DETAILED DESCRIPTION

Figure 5:
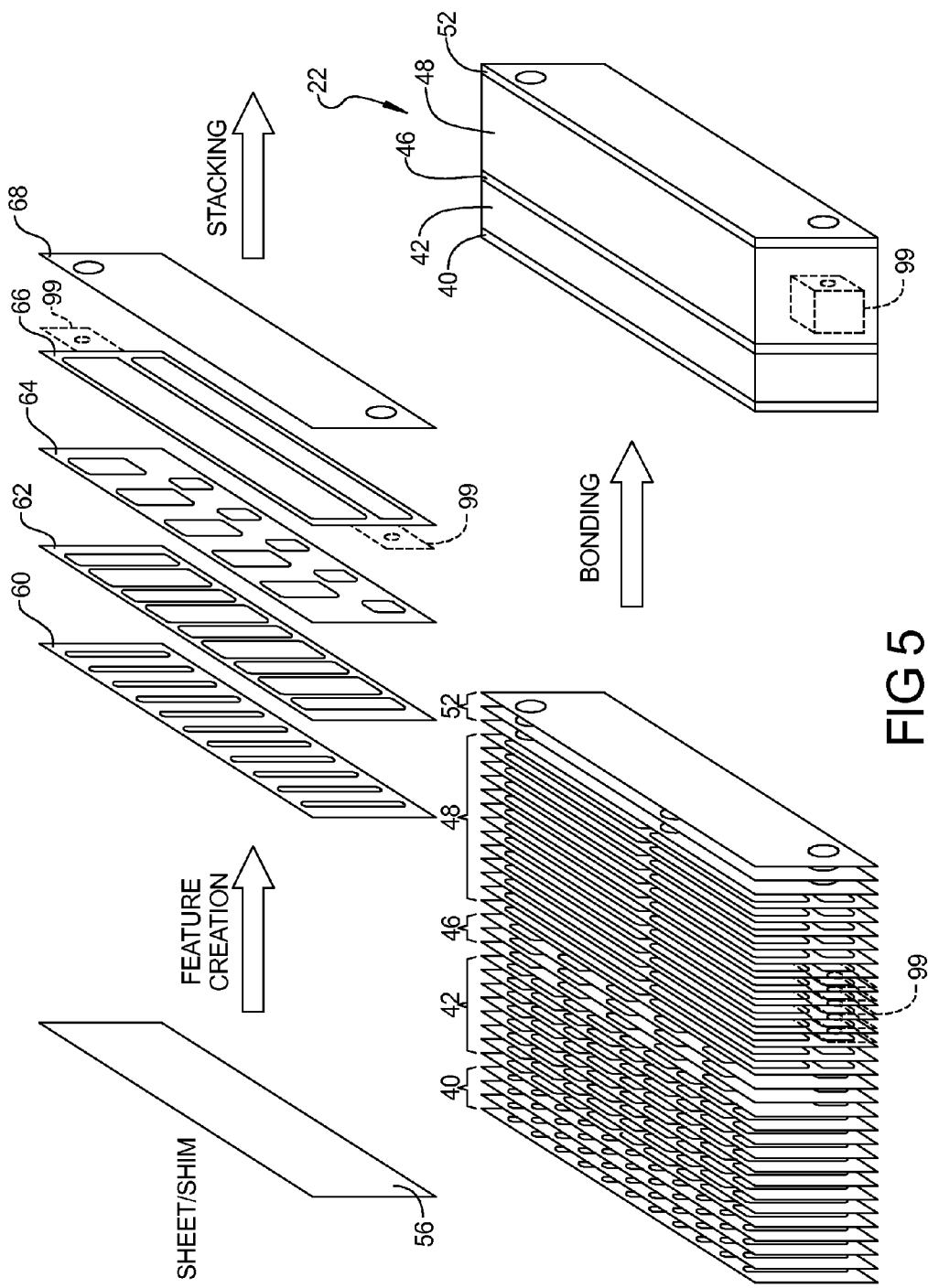
FIG. 5 is an illustration of the manufacturing steps to form a manifold for the heat exchanger of FIG. 1.

The following description is merely exemplary in nature and is not intended to limit the present teachings, applications, or uses. It should be understood that throughout the drawings, corresponding reference numerals indicate like or corresponding parts and features (e.g., 20, 120, 220, etc.). Furthermore, it should be understood that as used herein the terms "left," "right," "up," "down," etc. are relative terms and refer only to the orientations depicted in the drawings.

Referring to FIGS. 1 and 2, a microchannel heat exchanger 20 utilizing manifolds 22, 24 according to the present teachings is shown. Heat exchanger 20 includes a plurality of microchannel tubes 26 that extend between and communicate with manifolds 22, 24. A plurality of fins 28 is disposed between adjacent tubes 26 in heat-conducting relation therewith. A supply line 30 and a return line 32 are connected to and communicate with manifold 22. Supply line 30 is operable to supply a flow of coolant to heat exchanger 20, while return line 32 is operable to return coolant from heat exchanger 20 after having flowed therethrough. Microchannel tubes 26 include opposite major heat transferring surfaces 41 and opposite sidewalls 43 extending therebetween (FIG. 17A). Microchannel tubes 26 also include a plurality of channels or flow paths 45 extending along the length of the tubes.

Manifolds 22, 24 according to the present teachings can be formed from a plurality of individual sheets each having features/structure thereon that provide a desired flow path through the manifolds 22, 24. The sheets can be arranged into a plurality of sections with the sheets in each section having similar features thereon. The differing sections can have differing features to provide a desired flow path through the associated manifold.

Referring now to FIGS. 3 and 4, two different cross-sectional views of manifold 22 are shown. Manifold 22 includes a first section or layer 40 of sheets that are connected to microchannel tubes 26. A second section or layer 42 of sheets forms individual tube inlet/outlet chambers 44a, 44b. A third section or layer 46 of sheets is a transition section that forms supply/inlet transition ports or gates 47a, 47b that lead to a fourth section or layer 48 of sheets. Fourth section 48 defines respective supply and return chambers 50a, 50b. Third section 46 transitions the flow from supply chamber 50a to inlet chamber 44a via transition supply ports 47a and also transitions the flow from outlet chamber 44b to return chamber 50b via transition return ports 47b, as described below. A fifth section or layer 52 of sheets forms the end of manifold 22 and serves to connect manifold 22 to external components, such as supply and return lines 30, 32.

Referring now to FIG. 5, the steps associated with manufacturing the sheets and assembling the sheets to form a manifold are shown. The manufacturing process begins with a plurality of sheets, such as sheet 56. Sheets 56 can have desired features or structures formed therein to provide a desired functionality, as described below. The features on sheets 56 can be formed therein in a variety of manners. For example, sheets 56 can be punched, etched, or be laser cut, by way of non-limiting example. CNC tooling or other material removing tooling may be used, by way of non-limiting example.

The features or structures formed in sheets 56 can include a plurality of openings through the sheet that when aligned form a desired flow path. The sheets may additionally have a plurality of openings or webs which serve to reduce weight, limit or enhance heat transfer within the manifold, enhance structural soundness, form alignment locating features, mounting features, or the like that do not necessarily perform the function of a flow channel or boundary thereof. Sheets 56 can be aluminum, copper clad, nickel, stainless steel, plastic, or any other heat exchanger suitable material. Sheets are capable of being hermetically sealed/bonded together. As shown in FIG. 5, each of the plurality of plates provided in each section 40, 42, 46, 48 may be provided with openings that are similarly sized and shaped, such that they align upon lamination of the sheets to form the desired passageways in the manifold.

During the manufacture, specific features or openings are formed in sheets 56 to perform a desired function. For example, a plurality of sheets 60 can be formed to create first section 40, a plurality of sheets 62 formed to create second section 42, a plurality of sheets 64 formed to create third section 46, a plurality of sheets 66 formed to create fourth section 48, and a plurality of sheets 68 formed to create fifth section 52. Each plurality of sheets 60, 62, 64, 66, 68 is stacked together and aligned to form sections 40, 42, 46, 48, 52 having desired dimensions. The exact number of sheets utilized in each section 40, 42, 46, 48, 52 can vary depending upon the desired characteristics for the manifold formed therewith, as can the number of sections vary across the manifold depending on the desired characteristics.

With the plurality of sheets 60, 62, 64, 66, 68 all stacked and aligned together, the resulting manifold 22 can be created by bonding the various sheets 60, 62, 64, 66, 68 together. The bonding process can be a high-temperature melting process, such as brazing by way of non-limiting example, wherein sheets 60, 62, 64, 66, 68 are hermetically bonded together. It is envisioned that the manifolds formed with the plurality of sheets can be assembled and bonded along with the rest of the components of heat exchanger 20, such as with microchannel tubing 26 and fins 28. In this case, the manifold will be assembled along with the core of the heat exchanger using appropriate jigs and fixtures. A cladding material can be on the fins and on each of the sheets 60, 62, 64, 66, 68. Therefore, when the assembly moves through a brazing oven the microchannel tubes 26 will be bonded to both fins 28 and the manifold at the same time that the manifold structure is being bonded as well. Alternatively, the manifold could be brazed or formed separately, using a higher temperature braze/cladding than the rest of the heat exchanger. The forming of the manifold separately could simplify the fixturing and supporting of the heat exchanger during the brazing thereof. In some embodiments, some post-braze finishing steps may be necessary. Alternatively, by way of further non-limiting examples, the plurality of sheets can be bonded by diffusion bonding, ultrasonic welding, or any suitable bonding process, with or without intermediate cladding, glue, solvents, braze, plating, etc., as appropriate for the materials selected. In some embodiments, the manifolds 22, 24 may be manufactured using selective laser sintering, or direct laser sintering, or "3D printing," wherein the manifold is built up layer by layer using an additive process typically utilizing metal powders and liquid or granular polymers, although other materials are possible. New layers are added to existing layers by adding and bonding material in the area defined by a thin slice which may be equivalent to formed sheets 60, 62, 64, 66, and 68, although each sheet is created in-situ as the manifold is built up.

In some embodiments, the manifolds 22, 24 formed from a plurality of individual sheets can be utilized with a pre-assembled heat exchanger core. In particular, the microchannel tubes 26 and fins 28 can be pre-assembled to form a heat exchanger core. The manifolds 22, 24 can then be assembled and attached to the heat exchanger core to form fluid-tight bonds therewith. The manifolds 22, 24 could utilize a lower temperature braze/cladding than that utilized for the heat exchanger core. It may be advantageous to utilize readily available off-the-shelf heat exchanger cores with manifolds formed with the laminated sheets as discussed herein. This may advantageously allow for the customization of individual manifolds to allow the generic heat exchanger cores to be utilized in a variety of applications. In particular, a desired flow regime throughout the microchannel tubing 26 can be realized by forming the appropriate features within the sheets that are stacked and aligned together to form manifolds 22, 24, as described herein. The use of readily available generic heat exchanger cores can provide a cost advantage in that mass production of the heat exchanger cores may be realized. Additionally, the use of pre-manufactured heat exchanger cores can reduce the inventory of heat exchanger cores that must be maintained on hand to form heat exchangers for the various applications.

Figure 6:
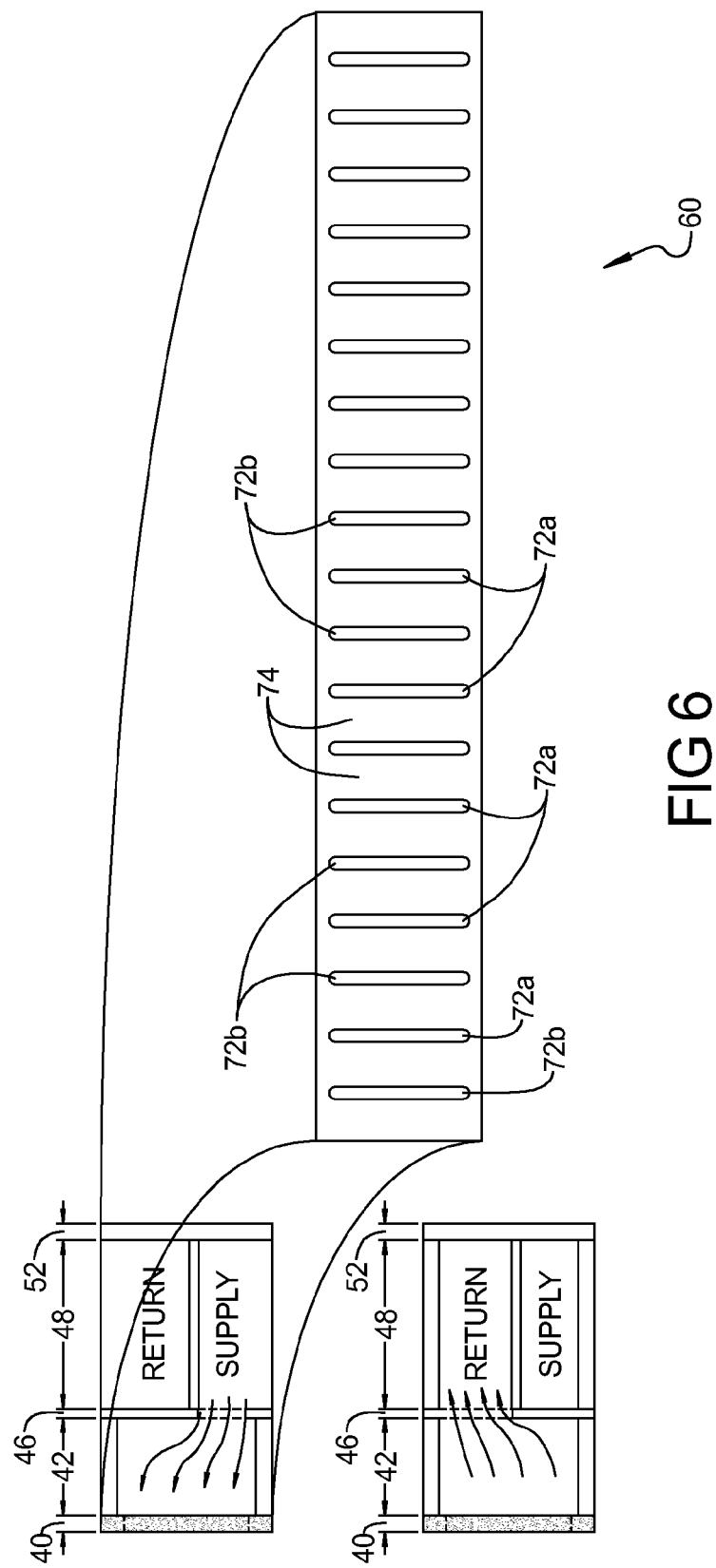
FIG. 6 is a plan view of an exemplary sheet used in the first section of the manifold of FIG. 1.

Referring now to FIG. 6, a plan view of a sheet 60 used in first section 40 is shown. Sheet 60 includes a plurality of slots 72a, 72b that are formed therein and separated by webs 74. Slots 72a, 72b are configured to receive microchannel tubing 26 therein. When sheets 60 are aligned and stacked together to form first section 40, slots 72a, 72b align with one another and form receptacles for microchannel tubing 26.

Figure 7:
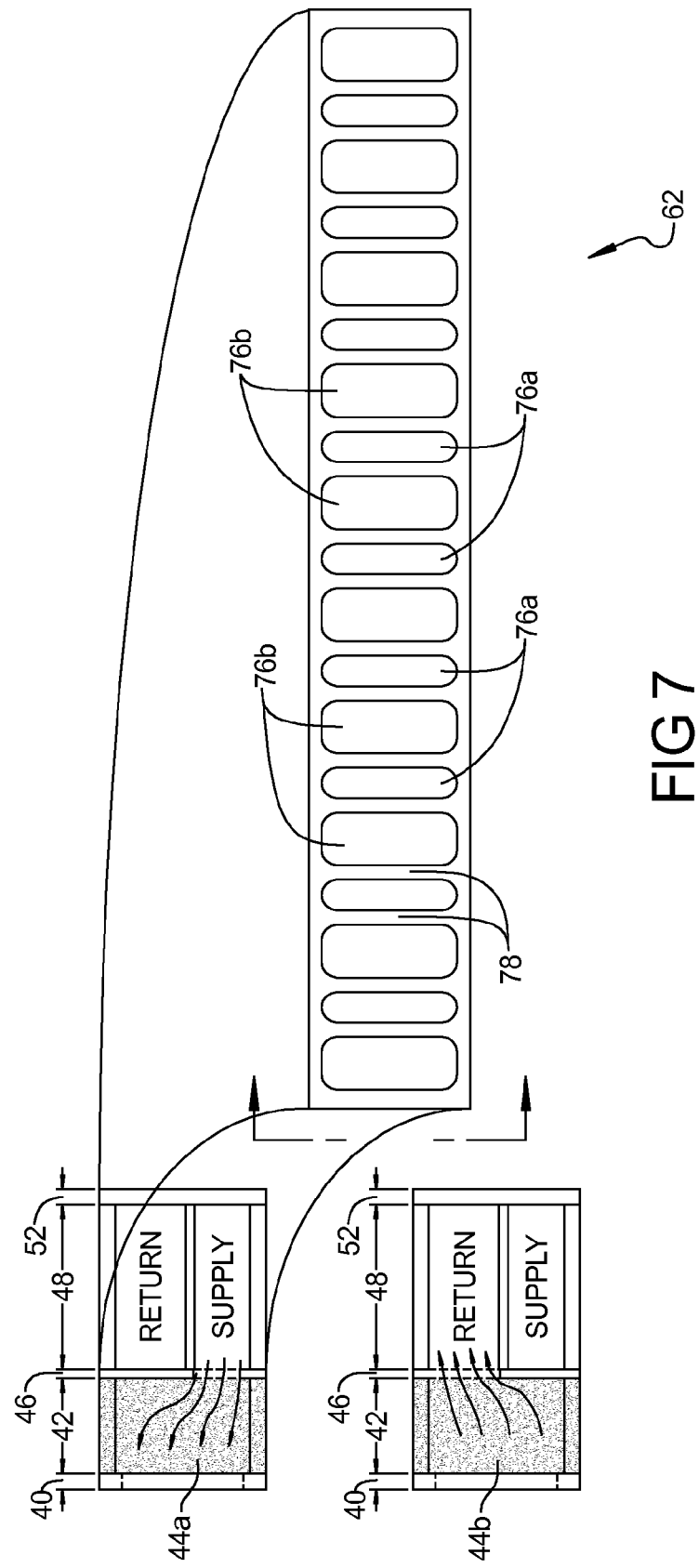
FIG. 7 is a plan view of an exemplary sheet used in the second section of the manifold of FIG. 1.

Referring now to FIG. 7, a plan view of a sheet 62 used in second section 42 is shown. Sheet 62 includes a plurality of slots 76a, 76b that form inlet and outlet chambers 44a, 44b, respectively, when stacked together to form second section 42. Return slots 76b can be larger than inlet slots 76a. The larger size of slots 76b can reduce the pressure drop associated with the coolant flowing through heat exchanger 20. Slots 76a, 76b align with slots 72a, 72b of sheets 60. Webs 78 separate slots 76a, 76b from one another. Webs 78 bond together and to webs 74 when forming manifold 22 such that a fluid-tight connection is formed therebetween and prevents coolant from leaking between adjacent slots.

Referring now to FIG. 8, a plan view of a sheet 64 used to form third section 46 is shown. Sheet 64 includes a plurality of supply openings 82a and return openings 82b. When a plurality of sheets 64 is stacked together to form section 46, supply openings 82a align with one another and form transition supply ports 47a while return openings 82b align with one another and form transition return ports 47b. Webs 84 extend between openings 82a, 82b and seal together and against webs 78 to provide a fluid-tight connection that prevents fluid from flowing between supply and return openings 82a, 82b. Return openings 82b can be larger than supply openings 82a to reduce the pressure drop of a fluid flowing through heat exchanger 20.

Referring now to FIG. 9A, a plan view of a sheet 66 used to form fourth section 48 is shown. Sheet 66 includes supply and return openings 88a, 88b. When a plurality of sheets 66 are stacked together, supply openings 88a align and form supply chamber 50a while return openings 88b align and form return chamber 50b. Web 90 separates supply and return openings 88a, 88b and bonds with other webs 90 in adjacent sheets 66 and with webs 84 to form a fluid-tight seal. Return opening 88b can be larger than supply opening 88a to reduce the pressure drop of a fluid flowing through heat exchanger 20.

In some embodiments, supply and return chambers 50a, 50b can be reinforced by dispersing one or more sheets 66', shown in FIG. 9B, among sheets 66 when forming fourth section 48. Sheet 66' includes a plurality of vertical webs 92 in addition to horizontal web 90. Vertical webs 92 form columns that can increase the structural integrity of fourth section 48 and manifold 22. The dimensions, locations, and quantity of webs 92 are such that the dispersion of sheets 66' throughout fourth section 48 does not significantly disrupt the flow therethrough. The inclusion of vertical webs 92 results in sheet 66' having a plurality of supply openings 88a and return openings 88b. While the use of webs has been defined in the context of the supply and return chambers, they are not limited to this portion of the laminate assembly and could be used on one or more other sheets in the assembly.

Referring now to FIG. 10, a plan view of a sheet 68 used to form fifth section 52 is shown. Sheet 68 is substantially solid with an inlet opening 96 and an outlet opening 98. When sheets 68 are stacked together to form fifth section 52, inlet openings 96 align and can receive supply line 30 while outlet openings 98 align and can receive return line 32. Supply and return lines 30, 32 can be attached to inlet openings 96 and outlet openings 98, respectively, in a fluid-tight manner so that coolant can be directed into and removed from heat exchanger 20. Inlet openings 96 communicate with supply openings 88a while outlet openings 98 communicate with return openings 88b.

As shown in FIG. 3, coolant is supplied to manifold 22 through supply line 30. Coolant in supply line 30 flows through inlet openings 96 in fifth section 52 and into supply chamber 50a of fourth section 48. From supply chamber 50a, the coolant flows through transition supply ports 47a of third section 46 and into inlet chambers 44a of second section 42. Inlet chambers 44a communicate with inlet slots 72a and direct coolant into microchannel tubing 26 disposed in inlet slots 72a.

The coolant then flows through the microchannel tubing 26 and into manifold 24 wherein the coolant is directed into the microchannel tubing 26 that are attached outlet slots 72b. The coolant flows though these microchannel tubing 26 and through outlet slots 72b of first section 40 and into outlet chambers 44b of second section 42, as shown in FIG. 4. The coolant flows into transition return ports 47b in third section 46. From there the coolant flows into return chamber 50b in fourth section 48. The coolant then flows into return line 32 through outlet openings 98 fifth section 52.

Thus, the various sheets 60, 62, 64, 66, 68 have features thereon that when aligned to form manifold 22 can direct the coolant through desired ones of microchannel tubing 26. The specific features of each sheet that forms the various sections 40, 42, 46, 48, 52 can be configured so that a desired flow path through exchanger 20 occurs. It should be appreciated that while details of manifold 24 are not shown, similar arrangements of sheets and features to that shown for manifold 22 can be employed to direct the fluid from one microchannel tubing 26 into a desired different microchannel tubing 26. Further, while the features of the flow channels have been depicted as substantially rectangular with rounded corners, any suitably shaped feature can be used including, but not limited to, triangular, square, round, oval, polygonal, closed spline, etc., and that each feature within a given sheet may be of a unique size or shape compared to adjacent features within a sheet, among a group of sheets, or within the assembly, as warranted by cost, fluid flow, structural soundness, or other considerations.

Referring now to FIG. 11, another heat exchanger 120 utilizing manifolds 122, 124, according to present teachings is shown. In heat exchanger 120, two different circuits are created to allow two separate coolant flows therethrough that do not intermix with one another. In this configuration, manifolds 122, 124 are made with a plurality of sheets 56 to form sections that direct flow through certain ones of microchannel tubes 126. Heat exchanger 120 includes a first supply line 131 that communicates with manifold 122 and a first return line 133 that communicates with manifold 124. A second supply line 135 communicates with manifold 124 while a second return line 137 communicates with manifold 122.

In heat exchanger 120, a first coolant flow is provided by first supply line 131 and is removed by first return line 133. Similarly, a second coolant flow is provided by second supply line 135 and removed by second return line 137. The first and second coolant flows do not intermix within heat exchanger 120. Rather, manifolds 122, 124 are configured to provide flow paths that maintain the first and second coolant flows separate from one another. For example, manifolds 122, 124 can both be similar to manifold 22 discussed above. Manifolds 122, 124 can be mirror images of one another and attached to opposite ends of heat exchanger 120 such that coolant supplied through first supply line 131 flows through one-half of the microchannel tubes 126 and exits through the return openings in manifold 124 and first return line 133. Similarly, the second coolant supplied by second supply line 135 can enter manifold 124 and flow through the other half of the microchannel tubing 126 and exit through the return openings in manifold 122 and second return line 137. In this manner, one-half of the microchannel tubes 126 have the first coolant flowing therethrough while the other half of the microchannel tubes 126 has the second coolant flowing therethrough. In this configuration, the coolant flows therethrough are single pass flows wherein the coolant enters one microchannel tube 126 through one end and exits through the opposite end and does not pass back through heat exchanger 120. The coolant fluids in this configuration may be of the same or different compositions, or likewise at the same or different pressures or operating conditions.

It should be appreciated, that manifolds 122, 124 can be configured differently if a different fluid flow therethrough is desired. For example, sheets 56 that form manifolds 122, 124 can have different features thereon such that the first coolant flow can travel through more or less than half of the microchannel tubing 126 while the second coolant flow travels through the remaining microchannel tubes 126. Additionally, manifolds 122, 124 could be arranged so that some of the coolant flow therethrough passes through heat exchanger 120 two or more times prior to exiting. This can be accomplished by providing desired fluid communication paths between the microchannel tubes 126 with the features in sheets 56 that form manifolds 122, 124.

It should be appreciated that manifolds 122, 124 can be configured differently so that return line 137 corresponds to supply line 131 and likewise return line 133 corresponds to supply line 135, so that fluid paths from each manifold are still not mingled, but enter and leave from the same manifold with fluid entering from the first manifold and directed through a microchannel, entering the second manifold and being redirected back through a second microchannel by the second manifold and then exiting the first manifold.

Figure 12:
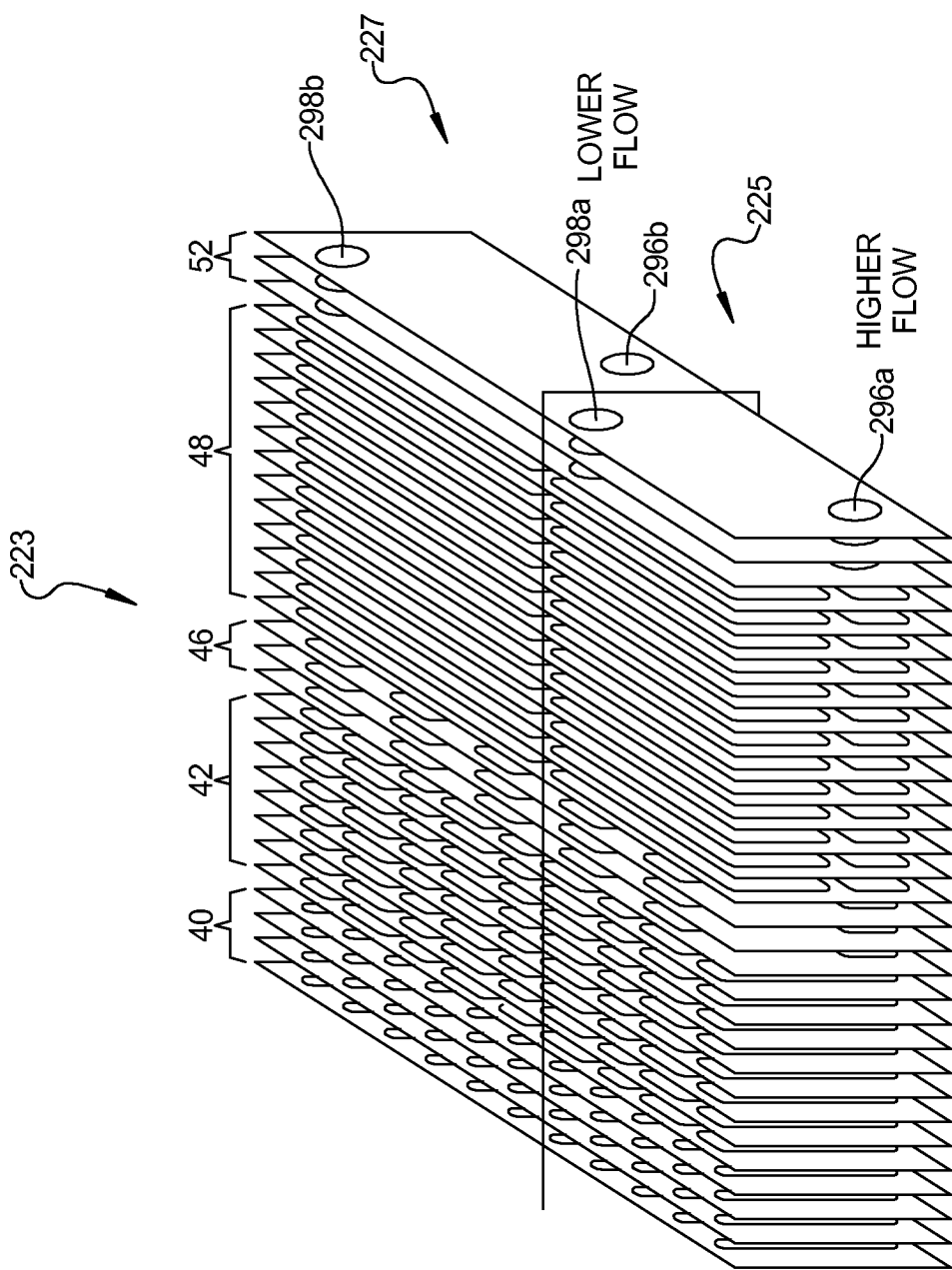
FIG. 12 is a perspective assembly view of another laminated sheet manifold according to the present teachings partitioned to provide differing flows through different sections thereof.

In another example, as shown in FIG. 12, a manifold 223 can be configured to receive and discharge two separate coolant flows from the same end of a heat exchanger. The sheets 56 that form manifold 223 can be configured to provide two different sections 225, 227. For example, a first section 225 can communicate with less microchannel tubing than a second section 227. As a result, the flow area for each section of the heat exchanger can be different, as can the flow rate be different. This can be accomplished with suitable restrictions within the manifold or, through the use of multiple inlet ports 296a, 296b and outlet ports 298a, 298b and, if needed, flow regulators external to the heat exchanger. Regardless of which method or methods are used to achieve different coolant flows and resultant coolant mass fluxes (mass flow per unit cross-sectional area) through each section, the mass flux in the first section 225 can be made greater than the mass flux through second section 227.

A heat exchanger having sections with differing coolant flow rates can be arranged so that the first section 225 (the section where greater removal of heat can occur) is located where a hot spot would occur in a traditional heat exchanger. As such, the positioning of such a heat exchanger adjacent to computer/electronic equipment can address the potential hot spots and, as a result, provide a desired level of cooling. Additionally, such an arrangement can result in the coolant flowing in the section associated with the hot spot remaining in either liquid phase or two-phase flow such that maximum cooling is achieved. Second section 227 can be positioned where less cooling is required with the coolant flowing therethrough also remaining in liquid phase or two-phase thereby improving cooling effectiveness.

Figure 13A:
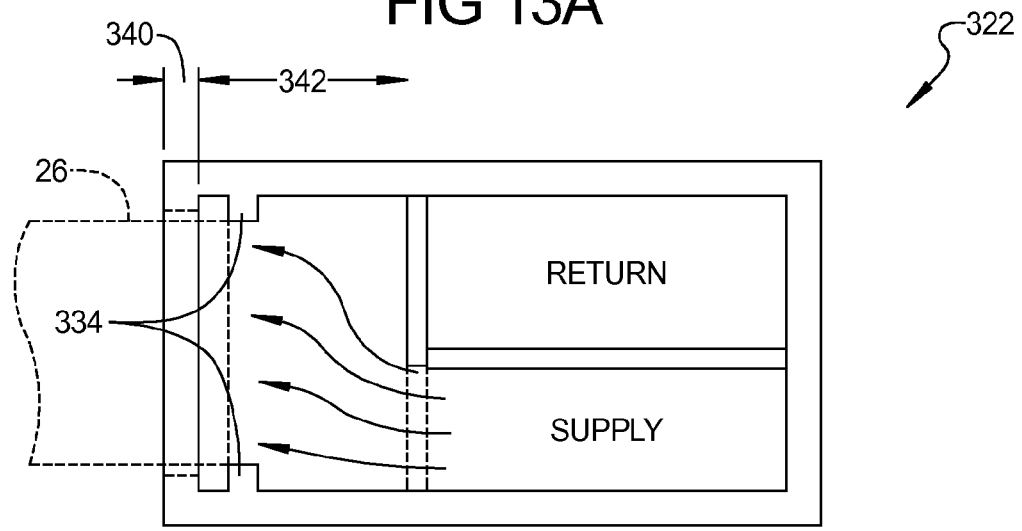
FIGS. 13A and 13B are cross-sectional views similar to FIGS. 3 and 4 showing an alternate construction for the second section of the laminated sheet manifold according to the present teachings.
Figure 13B:
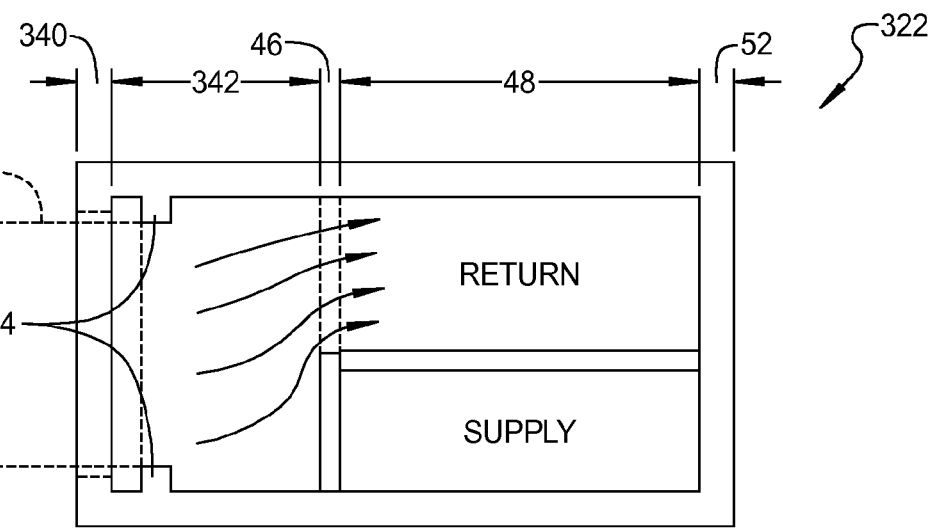

Referring now to FIGS. 13A and 13B, an alternate configuration for a manifold 322 is shown. Manifold 322 is similar to manifold 22 discussed above. In manifold 322, however, tab features 334 are located on some of the sheets 62 that form second section 342. Tab features 334 can be disposed in a desired position relative to first section 340. Tab features 334 reduce the size of the associated slots in second section 342 to limit the distance the microchannel tubing 26 (shown in phantom) can be inserted into manifold 322. Tab features 334 can thereby reduce the chance of over-insertion of the microchannel tubing into manifold 322.

Referring now to FIGS. 14A and 14B, the use of manifolds 422, 424 to couple two heat exchanger cores 434a, 434b together is shown. Heat exchanger 420 can include two cores 434a, 434b of differing sizes, as shown, or of the same size. Each heat exchanger core 434a, 434b includes a plurality of microchannel tubing 426a, 426b that are arranged adjacent one another into the page in the views depicted. The upper heat exchanger core 434a utilizes microchannel tubing 426a having a height $H_1$ that is greater than the height $H_2$ of the microchannel tubing 426b utilized in lower heat exchanger core 434b. As a result of the differing heights $H_1$, $H_2$, the flow velocities through heat exchanger cores 434a, 434b can be different or the same depending on local fluid density or phase conditions, relative cross-sectional areas, etc., and provide differing pressure drops thereacross. The differing pressure drops can advantageously allow for single-phase liquid flow and two-phase vapor and liquid flow therethrough. Microchannel tubes 426a, 426b of cores 434a, 434b can also be different to accommodate/optimize the single or two-phase flow and heat transfer characteristics of each core or section thereof.

Manifolds 422, 424 can be formed of a plurality of sheets 56 having features therein to provide a desired fluid flow through heat exchanger cores 434a, 434b. In particular, as shown in FIG. 14A, manifold 422 can include features for connecting supply line 430 and return line 432 thereto. Supply line 430 communicates with a supply chamber 450a which communicates with supply chamber 447a which communicates with inlet chamber 444a to supply the fluid to heat exchanger core 434b. Manifold 424 is also formed from a plurality of sheets 56 having the desired features therein. In particular, manifold 424 can include a transition chamber 454 that communicates with microchannel tubing 426 in both heat exchanger cores 434a, 434b. The fluid can then flow from first heat exchanger core 434b into upper heat exchanger core 434a and back to manifold 422 wherein it enters outlet chamber 444b. From outlet chamber 444b, the fluid flows through return chamber 447b, return chamber 450b, and into return line 432. Thus, in the heat exchanger 420 shown in FIG. 14A, the fluid flows through lower heat exchanger core 434b prior to flowing through upper heat exchanger core 434a, thereby completing two passes in the same vertical plane.

Heat exchanger 420 shown in FIG. 14A can advantageously be utilized as an evaporator wherein the fluid, such as in the form of a refrigerant, can enter into the smaller heat exchanger core 434b as a liquid or as a two-phase liquid and vapor mixture and can exit through the larger heat exchanger core 434a as a two-phase liquid and vapor mixture or as a superheated vapor. The larger size of upper heat exchanger core 434b facilitates the flow of the fluid in a two-phase liquid and vapor state to provide desired pressure drop considerations for the liquid refrigerant and the two-phase vapor and liquid refrigerant. It should be appreciated that each microchannel tubing 426b in lower heat exchanger core 434b can communicate with a single one of the microchannel tubings 426a in upper heat exchanger core 434a. However, if desired, multiple microchannel tubings 426a in each heat exchanger core 434a, 434b can communicate with one another through transition chamber 454 forming a one-to-one, one-to-many, or many-to-one relationship among microchannel tubes 426a and 426b. The heat exchanger 420 shown in FIG. 14A can advantageously be utilized as an evaporator.

In heat exchanger 420 shown in FIG. 14B, supply line 430 communicates with upper heat exchanger core 434a while return line 432 communicates with lower heat exchanger core 434b. In this configuration, heat exchanger 420 can advantageously be utilized as a condenser wherein the fluid, such as in the form of a refrigerant, enters as a vapor and makes two passes in the same vertical plane before leaving as a liquid. Again, the differing sizes $H_1$, $H_2$ of the microchannel tubings 426 can provide desired pressure drops and heat transfer characteristics across upper and lower heat exchanger cores 434a, 434b to accommodate the vapor and liquid phases of the fluid flowing therethrough in one-to-one, one-to-many, or many-to-one relationship among microchannel tubes 426a and 426b.

When multiple heat exchanger cores 434a, 434b are utilized with single manifolds 422, 424, the heat transfer fins 428 can be attached to and extend across the microchannel tubing 426 in both heat exchanger cores 434a, 434b (as shown in the left side on FIGS. 14A and 14B). Alternatively, individual fins 428 can be utilized with each heat exchanger core 434a, 434b (as shown in the right hand side in FIGS. 14A and 14B). Thus, heat exchangers 420 can be made with either individual discrete heat exchanger cores or as integral heat exchanger cores with two sets of microchannel tubings 426 that are coupled together as an integral unit with fins 428 extending between the two sets.

The flexible nature of manifolds 422, 424 can allow for heat exchangers 420 to be configured to have the supply and return lines 430, 432 communicate with either the right hand manifold or the left hand manifold, as shown in phantom. When communicating with the left hand manifold, the right hand manifold would then be configured to include a transition chamber 454. However, if desired, separate fluid flows through each heat exchanger 434a, 434b can be realized by providing separate inlets and outlets for each heat exchanger 434a, 434b in manifolds 422, 424.

Figure 15:
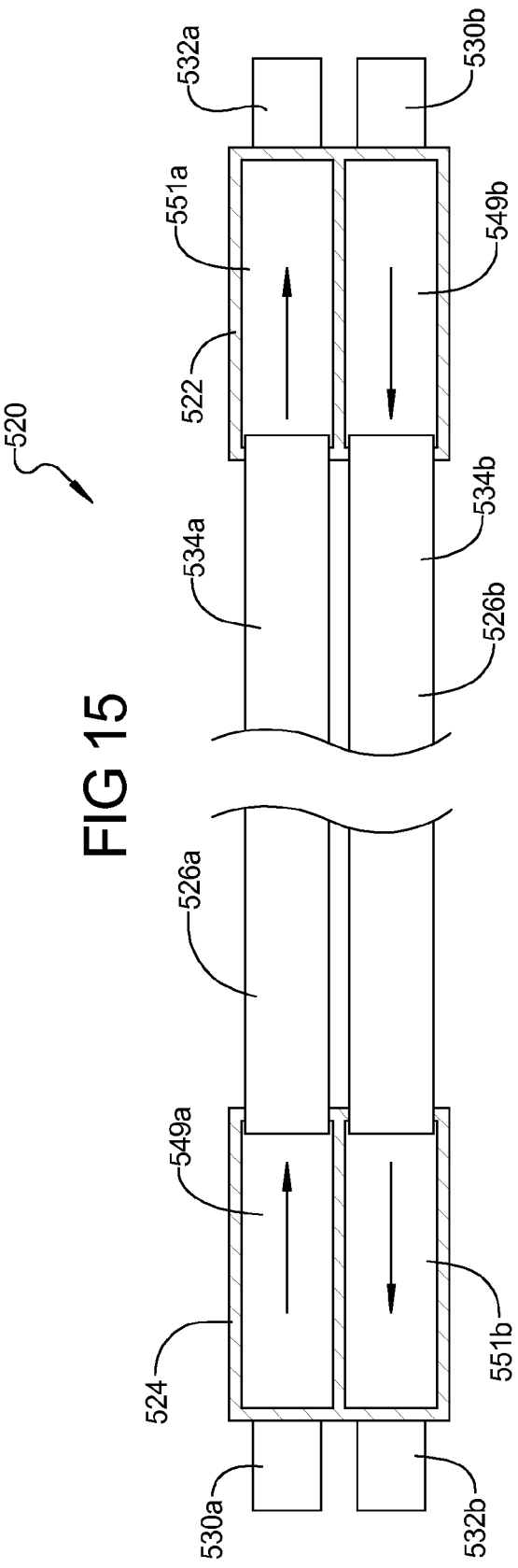
FIG. 15 is a partial cross-sectional view of laminated sheet manifolds according to the present teachings coupling two separate heat exchanger cores together to provide redundant heat removal.

Referring now to FIG. 15, another heat exchanger 520 utilizing manifolds 522, 524 according to the present disclosure is shown. Heat exchanger 520 can include upper and lower heat exchanger cores 534a, 534b that are each coupled to manifolds 522, 524 at opposite ends. Manifolds 522, 524 maintain heat exchanger cores 534a, 534b separate from one another so fluids can flow therethrough without intermixing. Manifolds 522, 524 are formed from a variety of sheets 56 having features thereon that enable this functionality. Manifold 522 includes a lower supply chamber 549b that communicates with microchannel tubing 526b of lower heat exchanger core 534b and a lower supply line 530b. Manifold 522 also includes an upper return chamber 551a that communicates with microchannel tubing 526a of upper heat exchanger core 534a and return line 532a. Manifold 524 includes a lower return chamber 551b that communicates with microchannel tubing 526b of lower heat exchanger core 534b and with lower return line 532b. Manifold 524 also includes an upper supply chamber 549a that communicates with microchannel tubing 526a of upper heat exchanger core 534a and with an upper supply line 530a.

Upper supply and return lines 530a, 532a can be in fluid communication with a first cooling fluid circuit while lower supply and return lines 530b, 532b can be in fluid communication with a second cooling fluid circuit. As a result, two different cooling fluid circuits, with potentially a different fluid type in each circuit, can provide two different fluid flows with each flow going to one of upper and lower heat exchanger cores 534a, 534b. These two heat exchanger cores 534a, 534b can provide cooling for a same component positioned in proximity thereto. Heat exchanger 520 can thereby provide redundant cooling wherein if one of the cooling fluid circuits were to fail or become inoperable, the other cooling fluid circuit can be utilized to provide a cooling fluid flow to heat exchanger 520. It should be appreciated that while heat exchanger 520 is shown as providing flow in each heat exchanger core 534a, 534b in opposite directions, the heat exchangers can be arranged in a co-flow configuration. Furthermore, it should be appreciated that each heat exchanger 534a, 534b be a single-pass or a multi-pass heat exchanger. Additionally, fins (not shown) can be specific to individual heat exchanger cores 534a, 534b or integral to both, as discussed above.

While multi-core heat exchangers are shown and described in reference to FIGS. 14A, 14B, and 15, it should be appreciated that the multiple heat exchanger cores therein can vary from one another and do not need to be identical for a particular heat exchanger. For example, a different number of microchannel tubes can be employed on the upper and lower levels, along with different microchannel tube designs, such as the fluid flow channels therethrough. Additionally, different pitches (tube-to-tube spacing) can be utilized on the upper and lower levels. As another example, the upper and lower tubes can be planar-aligned or non-aligned. Moreover, each heat exchanger core may be a multi-pass or a single-pass core and/or may utilize multiple manifold tubings to supply a single manifold tubing on the other heat exchanger core. Additionally, it should be appreciated that various combinations of these capabilities can be employed, depending on the desired functionality for the heat exchanger.

The use of single manifolds to provide fluid communication to multiple heat exchanger cores can advantageously reduce the size of heat exchangers having multiple cores. For example, because only one separating wall is needed to separate the tubes on the upper and lower heat exchanger cores, the use of two separate heat exchangers, each with its own manifolds, is avoided.

Figure 20:
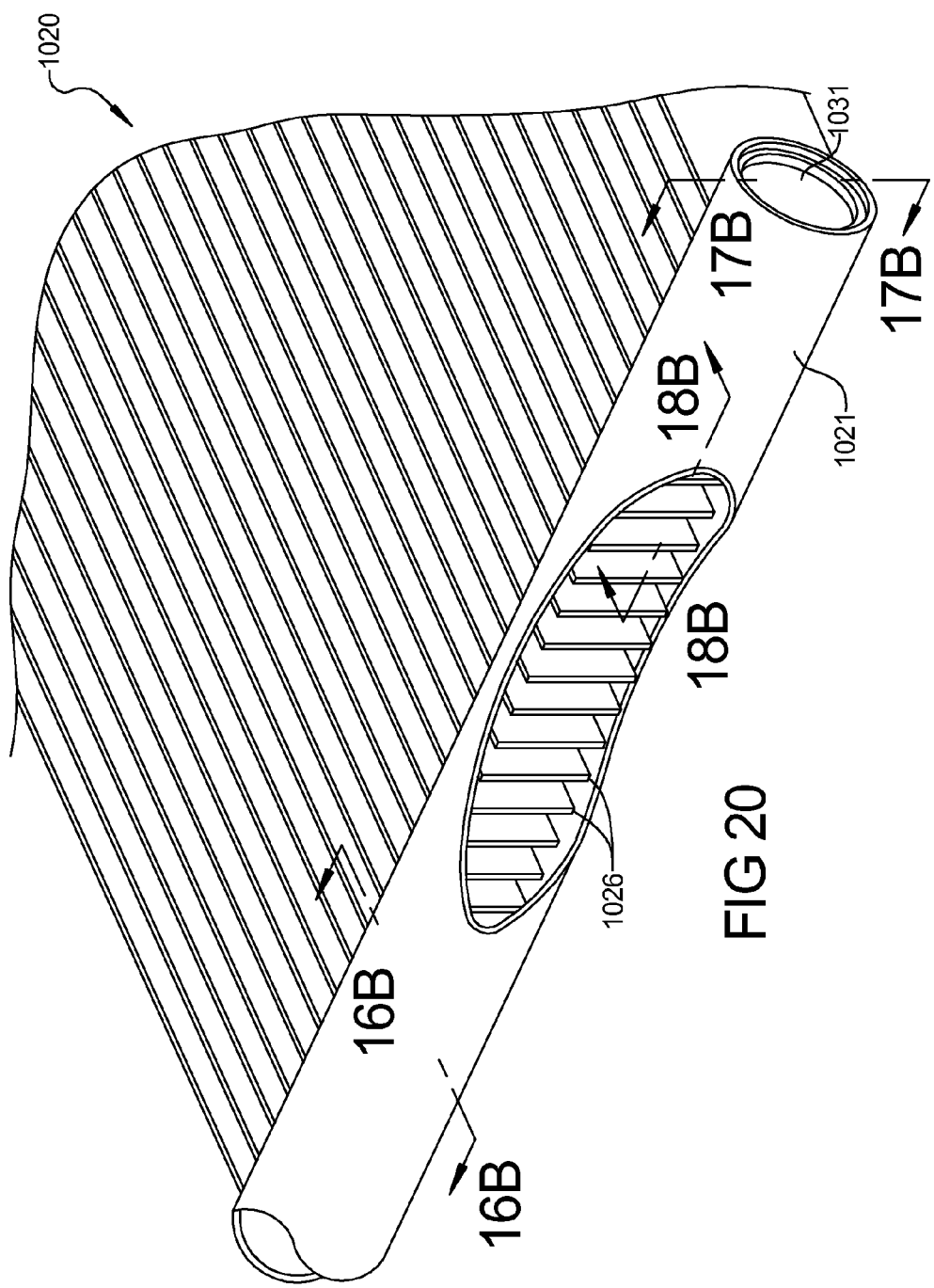
FIG. 20 is a fragmented perspective view of a prior art heat exchanger utilizing round piping manifolds.

Referring now to FIGS. 16-18 and 20, the manifolds constructed of a plurality of sheets 56 laminated together can advantageously provide additional space savings or increases in heat exchange area for a given confined space. Referring first to FIG. 20, a typical prior art heat exchanger 1020 utilizing microchannel tubing 1026 is shown. In the prior art heat exchangers, the manifold 1021 is formed of round piping. A plurality of slots is formed in the round piping to receive the ends of microchannel tubing 1026. An end cap 1031 is utilized to seal the end of the round pipe forming manifold 1021. Tubing 1026 can be brazed to the round pipe that forms manifold 1021 along with end cap 1031.

The use of manifolds according to the present teachings wherein a plurality of sheets 56 is arranged with specific features and laminated together can advantageously provide a larger surface area for heat transfer for a given packaging area and/or provide a reduced packaging area while providing an equivalent heat transfer area compared to heat exchangers formed with the prior art round-piping manifolds.

Referring now to FIGS. 16A and 16B, a comparison of the intrusion of the microchannel tubing into the interior cavity formed in a manifold 22, 24 of the present teachings to a manifold 1021 of the prior art is shown. Each manifold 22, 24, 1021 has a height $H_3$ that is the same. Additionally, in this example, the free flow area $A_1$ of manifolds 22, 24 of heat exchanger 20 are the same as the free flow area $A_2$ inside manifolds 1021 of heat exchanger 1020. The free flow area is the area inside the manifold that is outside of the area occupied by the portion of the tube inserted into the manifold.

Moreover, a length L of each heat exchanger 20, 1020 is the same. As shown in FIG. 16A, the end of microchannel tubing 26 intrudes into the interior cavity of manifolds 22, 24 a distance $D_1$. In contrast, as shown in FIG. 16B, the distance that microchannel tubing 1026 intrudes into the interior of manifold 1021 is a distance $D_2$. As shown, $D_2$ is significantly larger than the distance $D_1$. As a result, the overall available heat transfer length of a microchannel tube 1026 in heat exchanger 1020 may be less than a length of microchannel tube 26 in heat exchanger 20. The distance $D_3$ represents the increased amount of microchannel tubing 26 on each end, where microchannel tubing 26 is coupled to manifolds 22, 24, that can be utilized for heat transfer over that of a prior art heat exchanger 1020. It should be appreciated that $D_3$ is merely exemplary in nature and that the portion of microchannel tubing 1026 that is exterior to manifold 1021, but yet within the lines indicated by $D_3$, would also contribute slightly to the effective heat transfer area of microchannel tubing 1026, being limited in its effect due to the blockage of airflow by the intrusion of manifold 1021 into the airflow. As a result, the actual amount of increased surface area associated with microchannel tubing 26 that can be utilized is slightly less than that represented by reference indicia $D_3$.

The increased surface area realized by heat exchanger 20 is due to the use of manifolds 22, 24 that are rectangular in shape. The rectangular nature of the manifolds does not require that microchannel tubing 26 intrude into the interior cavity of each manifold 22, 24 as much as that required when round piping is utilized for the manifold. Additionally, the manifolds 22, 24 according to the present disclosure are suitable for use in high-pressure applications wherein the round piping manifolds 1021 are typically preferred due to the geometrically favorable strength per unit wall for the material utilized for round piping. As used herein, the term "high pressure" means an internal pressure greater than about 1.5 times the exterior pressure. The use of the plurality of sheets 56 laminated together can enable the application to be utilized in a high-pressure application due to the ability to provide webs or columns along the sheets 56 within the manifold to provide additional strength. Additionally, the openings in sheets 56 can have rounded corners to reduce stress concentrations.

Referring now to FIGS. 17A and 17B, another cross-sectional view of a manifold 22 according to the present disclosure is compared to a manifold 1021 utilizing round piping. As can be seen, end cap 1031 intrudes into the interior cavity of manifold 1021 such that the first microchannel tubing 1026 is spaced a distance $D_4$ away from the end of manifold 1021. The manifold 22 utilizing laminated sheets 56 has the end already incorporated into the sheets 56 so that the first microchannel tube 26 can be inserted closer to the end of manifold 22. As a result, the use of sheets 56 to form manifold 22 does not require the use of an end cap and the microchannel tubing 26 is spaced from the end of manifold 22 a distance $D_5$. As shown, distance $D_5$ can be significantly less than distance $D_4$. As a result, a manifold 22 having a given length can utilize more microchannel tubings than a manifold 1021 having the same length with the same spacing between individual microchannel tubings 1026.

Referring now to FIGS. 18A and 18B, another view of the intrusion of microchannel tubing 26, 1026 into manifolds 22, 1021, respectively, is shown. FIGS. 18A and 18B are similar to that shown in FIGS. 16A and 16B, however taken from a top down view. Microchannel tubing 26 intrudes into manifold 22 a distance $D_1$ while microchannel tubing 1026 intrudes into manifold 1021 a distance $D_2$. Again, it can be seen that the microchannel tubing 1026 intrudes into manifold 1021 a significant distance greater than that of microchannel tubing 26 into manifold 22. Furthermore, the increased intrusion into the interior cavity of manifold 1021 results in a larger volume of dead zones, wherein the coolant flow re-circulates but does not provide any heat-transferring function. For example, as shown in FIG. 18B, a dead zone 1039 extends from the ends of adjacent microchannel tubes 126 to the interior wall of manifold 1021. In contrast, as shown in FIG. 18A, the dead space 39 of manifold 22 is significantly less due to the more limited intrusion of microchannel tubing 26 into the interior cavity of manifold 22.

Thus, the manifolds made with sheets 56 according to the present disclosure can advantageously provide a more efficient packaging and conservation of space. As a result, for a given package size, the effective heat transfer surface area can be increased over that of a prior art heat exchanger 1020. Alternatively, a smaller more compact heat exchanger utilizing manifolds 22 according to the present teachings can be utilized to provide a same effective heat transfer area of a prior art heat exchanger 1020 while doing so in a smaller space and possibly include additional microchannel tubes 26. It should be appreciated that a balance between maximizing the heat transfer surface area and the packaging size can be performed to achieve a desired functionality for a heat exchanger according to the present disclosure.

Additionally, because a heat exchanger utilizing manifolds according to the present disclosure provides smaller dead zones 39, there is less excess volume within manifolds 22 that must be filled with coolant but yet provide no useful function. Further, the smaller dead zone 39 induces less turbulence into the flow than the manifold, thus reducing the manifold pressure drop and providing minimal impact on flow mal-distribution. This is in contrast to the larger dead zones 1039 of the prior art heat exchanger 120 utilizing a round piping manifold 1021 wherein there is an excess volume that must be filled with coolant while yet providing no useful function and further induce turbulence in the flow within the manifold, thus increasing the pressure drop and contributing to mal-distribution of the flow.

Referring now to FIGS. 19A and 19B, in some applications it may be desired to have the heat exchanger tilted relative to the airflow. For example, a heat exchanger 620 with a manifold 622 according to the present teachings formed from a plurality of sheets 56 can be arranged at an angle relative to an airflow thereacross. Similarly, as shown in FIG. 19B, a prior art manifold 1020 can also be arranged at an angle relative to the airflow thereacross. The prior art heat exchanger 1020, however, utilizes a round pipe manifold 1021 which requires that the microchannel tubing 1026 be inserted perpendicular to the axis of manifold 1021. This is due to the difficulty associated with forming insertion slots in manifold 1021 that are anything but a perpendicular direction relative to the axis of manifold 1021. As a result of the perpendicular nature of the slots and the microchannel tubing 1026, airflow across a prior heat exchanger 1020, when angled, requires the airflow to change direction at least once when flowing through heat exchanger 1020. This is shown in FIG. 19B wherein the airflow is horizontal on the left of heat exchanger 1021, extends upwards and to the right as it travels between microchannel tubing 1026, thus switching direction at least once, and subsequently exits heat exchanger 1020 and may continue upwardly (not shown) or return to a generally horizontal flow downstream of heat exchanger 1020.

In contrast, a heat exchanger 620 utilizing manifold 622 according to the present disclosure is not limited to having the microchannel tubing 626 be perpendicular to the axis of manifold 622. Rather, because individual sheets 56 are utilized to form manifold 622, the features within sheets 56 can include slots that are angled relative to the axis of sheets 56 such that microchannel tubing 626 can extend generally parallel with the airflow. As a result, airflow through heat exchanger 620 is not required to change direction as it flows between microchannel tubings 626. As a result, the airside pressure drop across heat exchanger 620 is less than that experienced when a prior art heat exchanger 1020 is utilized. The use of individual sheets 56 to form manifold 622 allows for the slots therein to be angled at any orientation relative to the sheet 56 to provide or accommodate a desired tilting of heat exchanger 620 relative to the exterior airflow.

Figure 19C:
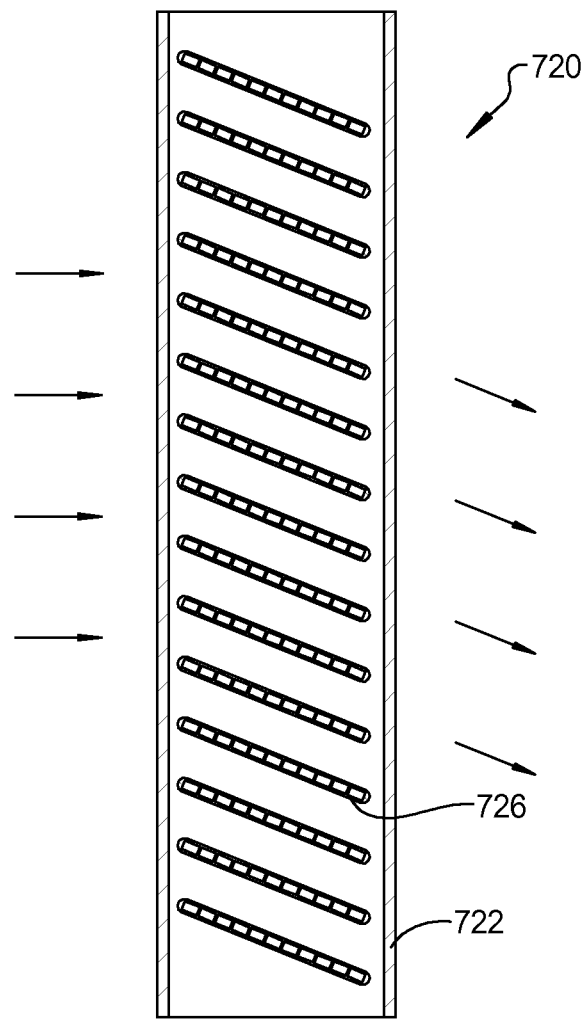
FIG. 19C is a representation of another tilted heat exchanger utilizing a laminated sheet manifold according to the present teachings.

Referring now to FIG. 19C, a heat exchanger 720 utilizing a manifold 722 formed with a plurality of sheets 56 according to the present teachings can be configured to intentionally re-direct airflow therethrough. As shown, manifold 722 can be generally perpendicular to the airflow while microchannel tubes 726 can be angled relative to the axis of manifold 722 and the direction of the airflow. The use of individual sheets 56 to form manifold 722 facilitates the formation of features in sheets 56 wherein the slots are angled relative to the axis of sheet 56 such that microchannel tubing 726 can be skewed relative to the direction of the airflow. As a result, the airflow flowing through heat exchanger 720 will change direction at least once. In this manner, the direction of the airflow exiting heat exchanger 720 can be advantageously angled to a desired orientation so that it flows in a desired direction downstream of heat exchanger 720.

Manifolds formed according to the present disclosure wherein individual sheets 56 when laminated together can advantageously include features that reduce the possibility for mal-distribution of the cooling fluid flowing into microchannel tubes 26. When a driving fluid pressure is not equal across each of the microchannel tubings, neither is the flow of the cooling fluid therethrough. The length of the manifold, the location of the inlet and outlet ports, and the uniformity of the heat load across the face of a heat exchanger all affect the pressure gradient within each manifold. With a laminated sheet method of construction according to the present teachings, an interior cross-section within the manifold can be designed to vary along the length of the manifold. This allows the designer the ability to tailor pressure drops associated with: (1) flow from the supply inlet to the given microchannel connection; (2) flow from the connection into the given microchannel; (3) flow out of the given microchannel to the outlet channel; and (4) flow along the outlet channel to the outlet. This can allow the designer to have multiple microchannel flow paths with substantially the same overall sum of pressure drops and thereby have substantially the same overall flow therethrough which is advantageous for substantially uniformly thermally loaded heat exchanger coils. If the pressure drops are substantially different, then the flows will be substantially different and can cause mal-distribution of the fluid flow and, as a result, the maximum potential thermal capacity of the heat exchanger may be reduced for substantially uniformly loaded heat exchanger coils. As a result, the maximum potential thermal capacity of the heat exchanger may be reduced.

Manifolds made with the sheets 56 according to the present teachings can take advantage of the ability to form specific features in each sheet 56 to provide a series of inlet orifices just upstream of each of the inlets to the microchannel tubings. For example, inlet and/or outlet chambers 44a, 44b can be configured so that the chambers closest to supply line 30 have flow restrictions therein formed by smaller openings, while the ones located furthest away from supply line 30 can have restrictions formed by larger openings, thereby reducing the pressure drop thereacross. As a result, the flow through microchannel tubes 26 can be balanced so that substantially a same flow rate therethrough is achieved and chance of mal-distribution of the cooling fluid is minimized. As a result, the pressure drop across the orifices to the microchannel tubings that are closest to the supply line 30 can be made to account for the pressure drop along the length of manifolds 22, 24 as the flow travels therealong from supply line 30 to return line 32.

Therefore, given a heat load distribution and the locations of supply line 30 and return line 32, the designer could control or vary the size of the orifices formed in sheets 56 feeding microchannel tubes 26 and thereby equalize the driving pressure drop across each of the microchannel tubes 26 to minimize the chance of mal-distribution of the cooling flow. Of course, it should be appreciated that the same techniques can be utilized to cause a desired mal-distribution of the cooling fluid flowing therethrough. For example, if the component to be cooled by the heat exchanger has known heat concentrations, the manifolds 22, 24 can be configured so that the flow of the cooling fluid through the microchannel tubings 26 associated with the locations of the heat spots have a greater flow than the flow through microchannel tubing 26 not associated with the hot spot. As a result, adequate heat removal can be achieved by designing a preferred mal-distribution of the cooling fluid through the heat exchanger.

Referring to FIGS. 1, 2, and 5, a heat exchanger 20 utilizing manifolds 22, 24 can optionally include mounting features 99 (shown in phantom) that facilitate the mounting of heat exchanger 20 in a desired position. For example, as shown, sheets 56 can include a feature or projection that extends outwardly beyond the main side edge of manifolds 22, 24 and can have an opening therethrough. In one exemplary embodiment, mounting feature 99 is integral with sheets 66 of fourth section 48. As a result, when heat exchanger 20 is formed with manifolds 22, 24, mounting features 99 can be used to mount heat exchanger 20 in a desired location. It should be appreciated that mounting features 99 can be integral to other ones of sheets 56 and can extend therefrom in different directions to provide mounting features 99 in a desired orientation from mounting heat exchanger 20 in the desired application. Additionally, mounting features 99 can be internal features. For example, as shown in FIG. 18A, mounting features 99 can be holes or recesses in the side therein that allow a fastener, such as a screw, to be fastened thereto. Mounting feature 99 can be provided by a buildup of sections of sheets 56 and subsequently drilled or machined into the manifold. Alternatively, mounting feature 99 can be formed by a plurality of openings formed in sheets 56 that align with one another and that can receive a fastener therein without machining or processing. Again, it should be appreciated that the mounting features 99 can be configured along different locations of manifolds 22, 24 to provide mounting features 99 in a desired orientation for the application in which heat exchanger 20 is to be utilized. Thus, the use of manifolds formed with a plurality of laminated sheets 56 can advantageously facilitate the inclusion of mounting features therein to allow for the easy securing of heat exchanger 20 in a desired application. Features can also be added for locating pins or locating datums that abut corresponding locating guides in the desired application. The locating features are more easily provided to a given positional accuracy by including the features in the laminate sheets 56 than locating features which could be added in a post-coil-assembly process in typical prior art heat exchangers.

Figure 21A:
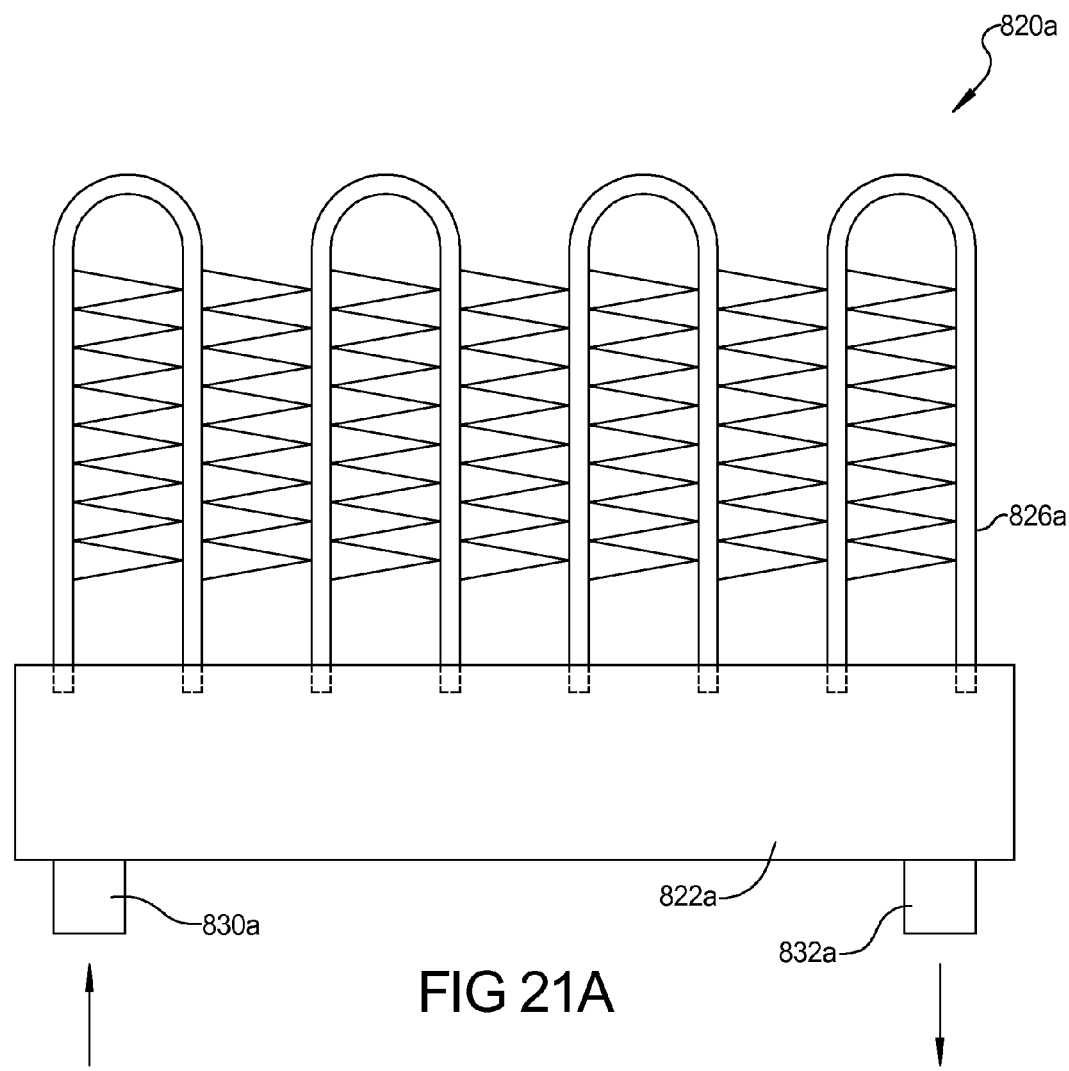
FIGS. 21A-C are plan views of additional exemplary heat exchangers utilizing a single laminated sheet manifold according to the present teachings.
Figure 21B:
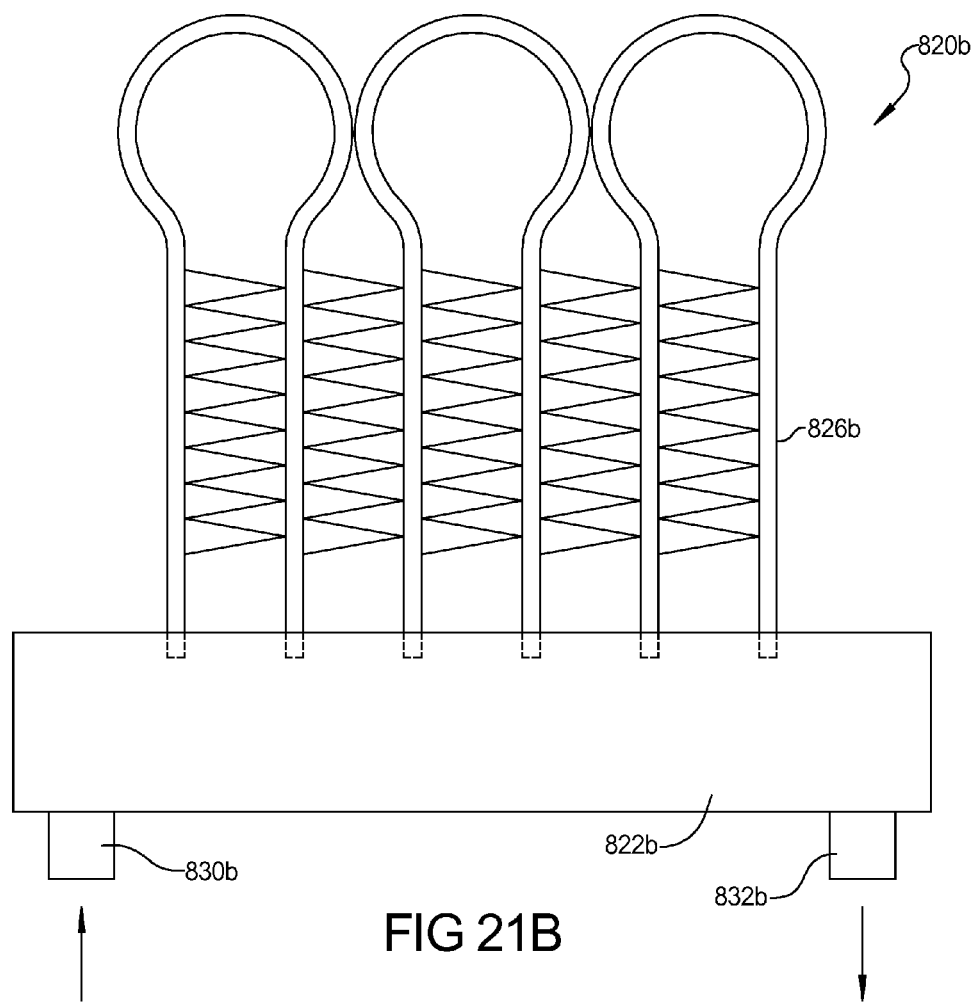
Figure 21C:
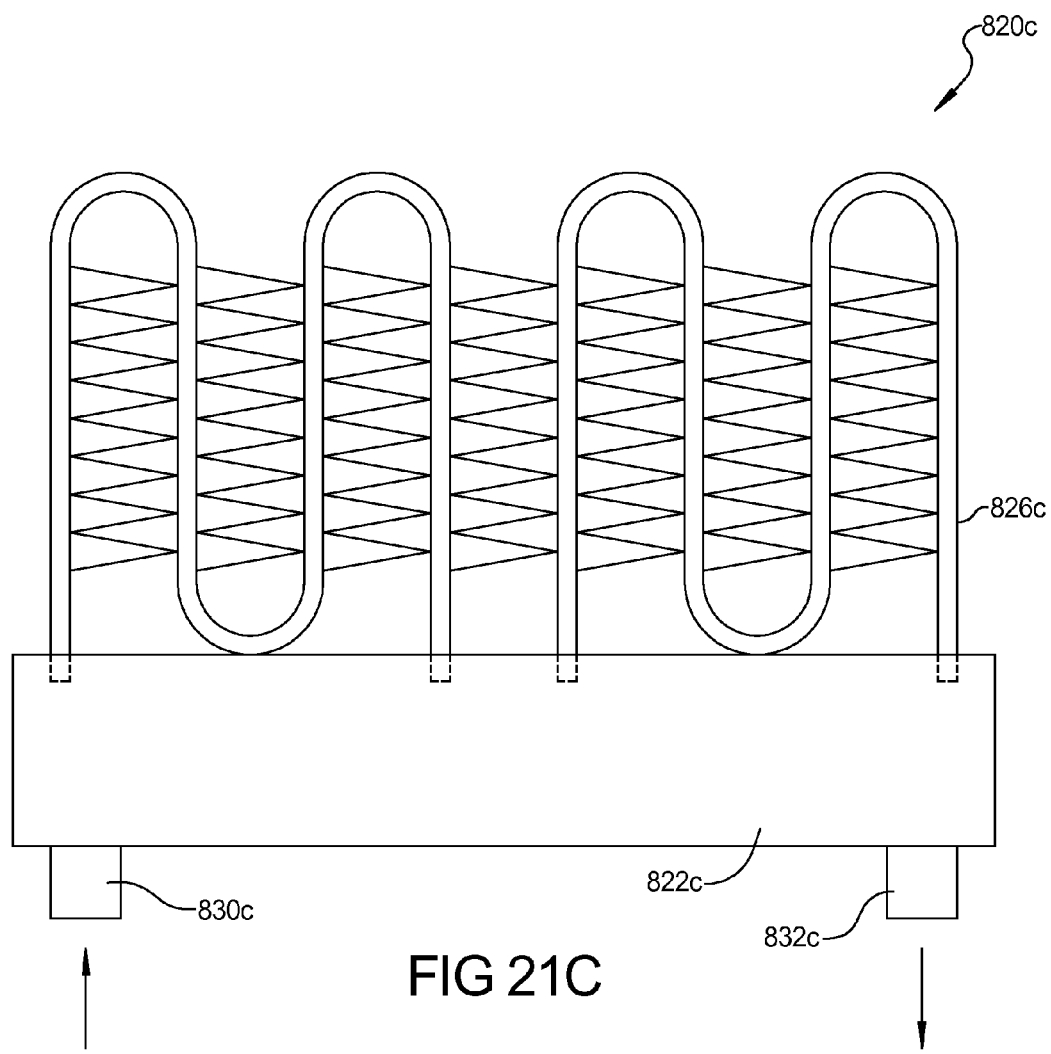

Referring now to FIGS. 21A-C, heat exchangers 820a-c utilizing single manifolds 822a-c made from a plurality of sheets 56 according to the present teachings are shown. In heat exchangers 820a-c, a plurality of microchannel tubes 826a-c have both of their ends in fluid communication with manifold 822a-c. Sheets 56 that form manifolds 822a-c include features therein that allow for a desired fluid flow from the supply lines 830a-c through microchannel tubes 826a-c and into return lines 832a-c. The features can provide for the fluid flowing through each microchannel tube 826a-c a single time or through multiple ones of the microchannel tubes 826a-c prior to exiting into return lines 832a-c. As shown in FIG. 21A, microchannel tubes 826a can be generally U-shaped. As shown in FIG. 21B, in some embodiments the microchannel tubes 826b may have a more bulbous or bell-type transition from heading away from manifold 822b to returning toward manifold 822b. As shown in FIG. 21C, microchannel tubes 826c can be serpentine shaped and provide four or more passes prior to returning to manifold 822c.

In heat exchangers 820a-c, the features in the sheets 56 can provide flow passageways such that the cooling fluid only flows through a single one of microchannel tubes 826a-c or through multiple ones of microchannel tubes 826a-c. Thus, heat exchangers 820a-c can be multi-pass heat exchangers wherein multiple passes of the fluid can be achieved by flowing through a single one of microchannel tubes 826a-c as the fluid flows away from and then returns to the associated manifold 822a-c. Moreover, if desired, the designer can configure the features in sheets 56 to allow the cooling fluid to experience a greater number of passes by providing serial fluid communication between multiple ones of microchannel tubes 826a-c. In some embodiments, the designer can configure the features in sheets 56 to provide some microchannel tubes 826a-c in series flow arrangement with one another while other microchannel tubes 826a-c are in parallel flow arrangement with one another and combinations thereof. Furthermore, it should be appreciated that while the microchannel tubes 826a-c are all shown as having a generally same length of extension from manifolds 822a-c, individual microchannel tubes 826a-c can have varying lengths to provide a desired heat transfer surface area and positioning for a particular application. Additionally, the use of manifolds made from a plurality of sheets 56 can facilitate these varying lengths of the microchannel tubings 826a-c due to the use of a single manifold to provide supply and return passages for each one of microchannel tubes 826a-c. The use of a single manifold 822 can reduce the cost of heat exchanger 820 due to only needing to provide a single manifold 822. Additionally, the use of a single manifold 822 can increase the available heat transfer surface area for a given packaging space or provide a smaller packing space requirement for a given heat transfer area due to the absence of a second manifold. The absence of the second manifold can allow the microchannel tubes 826 to extend further away from manifold 822 without increasing the size of heat exchanger 820 over those utilizing two manifolds.

Thus, the use of manifolds according to the present teachings can allow the heat exchanger designer to define the direction of coolant flow for each individual microchannel tube. The liquid coolant phase can be better distributed across the heat exchanger. The liquid coolant can be concentrated to specific hot spots in cases where the heat exchanger is in close proximity to the heat source. Multiple circuits can supply coolant to the same heat exchanger with the coolant from each being evenly distributed across the heat exchanger (providing some degree of redundancy) or concentrated in specific sections. Coolant flow can be unevenly distributed through sections of the heat exchanger to give more flow to some areas (hot spots) and less to others. The flexibility provided to the design of coolant flow and distribution, by the manifolds according to the present teachings, allows the designer to easily customize the manifold(s) to specific applications. Additionally, the flexibility of the design of manifolds utilizing laminated sheets 56 allows for the manifolds to provide fluid flows to multiple heat exchanger cores. The separate heat exchanger cores can be maintained separate such that the fluids flowing therethrough do not intermix or can be combined so that fluid flows through one of the heat exchanger cores and then the other one of the heat exchanger cores. This capability reduces the spatial requirements for a heat exchanger utilizing multiple cores through the use of common manifolds for each of the heat exchangers. Additionally, the use of the manifolds according to the present teachings can allow an increase in the heat transfer surface area for a given space or provide an equivalent heat transfer surface area for a smaller space over a prior art heat exchanger utilizing round pipe manifolds. Moreover, the limited intrusion of the microchannel tubing by the use of the manifolds according to the present disclosure can reduce the possibility of mal-distribution and/or dead spots for volume within the manifolds that do not serve a cooling function.

While the manifolds and heat exchangers are described herein by reference to specific examples and embodiments, it should be appreciated that changes and alterations to the embodiments disclosed can be made. For example the slots/openings in the various sheets can be rounded to increase structural integrity. The manifolds can be utilized on other types of heat transfer tubing than microchannel tubing, although all of the benefits of the present invention may not be realized. For example, round heat transfer tubing can be utilized wherein the round ends are accommodated by the manifolds or the ends are flattened to provide a generally rectangular cross-section that can be received within the manifolds.

Moreover, different flow configurations can be created through the use of sheets, as desired. Furthermore, the various components and features of the different embodiments can be mixed and matched, as desired, to achieve a desired functionality. Moreover, other mechanisms or arrangements that provide similar functionality can also be employed. Additionally, the manifolds are not limited to the assembly direction shown and can be assembled with sheets oriented left to right, top to bottom, or front to back, and combination thereof, with respect to the direction of flow through the microchannels, as fits the desired inlet and outlet port locations, available sheet stock size, oven size, stacking/clamping preferences, etc. Thus, the specific examples, illustrations, and embodiments disclosed herein are merely representative in nature and changes and alterations to the embodiments shown should be considered to be within the scope of the claims.

What is claimed is:

1. A heat exchanger comprising:
   a plurality of tubes having opposite first and second ends with at least one flow path extending therebetween, said tubes arranged adjacent one another;
   a plurality of fins in heat-transferring relation with said tubes; and
   a first manifold in fluid communication with said first ends of said tubes, said first manifold comprising
   a plurality of sections each having a different flow configuration, the plurality of sections including at least
   a first section configured to connect to the tubes,
   a third section adapted to form an end of the manifold and configured to fluidicly couple with at least one of a supply line and a return line, and
   a second section disposed between the first and third sections;

wherein at least the second section comprises a plurality of sheets each having a same arrangement of one or more similarly sized and shaped openings therethrough, said sheets being laminated together with said openings in each of said sheets aligned with openings in other ones of said sheets to form flow passageways through said second section, said flow passageways constituting at least a portion of a fluid flow path through said third section and at least a first group of said tubes.

2. The heat exchanger of claim 1, further comprising a second manifold in fluid communication with said second ends of said tubes, said second manifold comprising a plurality of sheets having one or more openings therethrough, said sheets being laminated together with said openings in each of said sheets aligned with openings in other ones of said sheets to form flow passageways through said second manifold that are in fluid communication with said at least one flow path in said tubes, said flow passageways in said first and second manifolds allowing said fluid to flow into said first manifold and through at least the first group of said tubes and into said second manifold.

3. The heat exchanger of claim 1, wherein each of said tubes includes first and second major heat transfer surfaces and a pair of minor sidewalls extending therebetween and a plurality of microchannels extending between said first and second ends and forming a plurality of flow paths therethrough.

4. The heat exchanger of claim 2, wherein said passageways allow said fluid to flow from said second manifold through a second group of said tubes different from said first group and into said first manifold.

5. The heat exchanger of claim 4, wherein said first group of tubes are associated with a first heat exchanger core, said second group of tubes are associated with a second heat exchanger core, and said first and second cores are adjacent one another such that a single exterior fluid flow flows across both of said first and second cores.

6. The heat exchanger of claim 5, wherein said tubes in said first group have a first size, said tubes in said second group have a second size and said first size is different from said second size.

7. The heat exchanger of claim 5, wherein said tubes in said first and second groups are substantially a same size.

8. The heat exchanger of claim 2, wherein said first group of tubes is associated with a first heat exchanger core, a second group of said tubes different than said first group is associated with a second heat exchanger core, and said passageways allow a first fluid to flow between said first manifold, said first group of tubes, and said second manifold, and allow a second fluid to flow between said first manifold, said second group of tubes, and said second manifold and maintain said second fluid separate from said first fluid, and said first and second cores are adjacent one another such that a single exterior fluid flow flows across both of said first and second cores.

9. The heat exchanger of claim 8, wherein said first and second cores are substantially identical.

10. The heat exchanger of claim 1, wherein at least one group of said sheets that form said first manifold includes a mounting feature that allows the heat exchanger to be mounted in a desired position.

11. The heat exchanger of claim 10, wherein said mounting feature includes a projection on each sheet in said at least one group which extends outwardly beyond adjacent sheets.

12. The heat exchanger of claim 10, wherein said mounting feature includes an opening extending into said at least one group of sheets through an exterior edge.

13. The heat exchanger of claim 1, wherein passageways in said first section of the manifold receive said first ends of said tubes and include stops that limit the distance said tubes can be inserted into said first manifold.

14. The heat exchanger of claim 13, wherein said stops include projections in a plurality of sheets that extend into openings in said sheets.

15. The heat exchanger of claim 1, wherein said first manifold has a longitudinal axis, said tubes are skewed relative to said axis such that said tubes extend substantially orthogonally from a facing end surface of said first manifold and diagonally across said facing end surface at a non-orthogonal angle relative to said axis.

16. The heat exchanger of claim 1, wherein said openings in said sheets in said first manifold are of differing sizes such that said flow passageways result in a flow rate of fluid through said tubes being non-uniform.

17. The heat exchanger of claim 1, wherein both of said first and second ends of said tubes extend from said first manifold such that said fluid flowing therethrough originates from and returns to said first manifold.

18. A heat exchanger system comprising:
at least one heat exchanger core including a plurality of microchannel tubes with opposite first and second ends and a plurality of microchannels extending therebetween and a plurality of fins in heat-conducting contact with said tubes;
a first fluid flowing through said microchannels in said tubes;
an air-flow flowing across an exterior of said at least one core in heat-transferring relation with said first fluid through said at least one core; and
first and second manifolds attached to said first and second ends, respectively, and in fluid communication with said microchannels, each one of said manifolds comprising a plurality of sections each having a different flow configuration, the plurality of sections including at least
a first section configured to connect to the tubes,
a third section adapted to form an end of the manifold and configured to fluidicly couple with at least one of a supply line and a return line, and
a second section disposed between the first and third sections;
wherein at least the second section comprises a plurality of sheets each having a same arrangement of one or more openings therethrough,
said sheets being laminated together with said openings in each of said sheets aligned with openings in other ones of said sheets to form flow passageways through said second section,
said flow passageways constituting at least a portion of a fluid flow path allowing said first fluid to flow from said first manifold, through at least a first group of said tubes in said at least one core and into said second manifold.

19. The heat exchanger system of claim 18, wherein said first and second manifolds have longitudinal axes that are substantially parallel with one another, said axes are non-orthogonal with respect to a flow direction of said airflow, and said tubes are skewed relative to said axes such that opposite major heat-transferring surfaces of said tubes are substantially parallel with said flow direction of said air-flow.

20. The heat exchanger system of claim 18, wherein said at least one heat exchanger core includes first and second heat exchanger cores each having microchannel tubes in fluid communication with flow passageways in said first and second manifolds such that said first fluid can flow between at least one of said first and second manifolds and said first heat exchanger core and said first and second manifolds and said second heat exchanger core, and said first and second heat exchanger cores are adjacent one another such that said airflow flows across both of said first and second heat exchanger cores.

21. The heat exchanger system of claim 18, wherein said openings in said sheets are of differing sizes such that a flow rate of said first fluid through said tubes is non-uniform.

22. The heat exchanger system of claim 18, wherein said openings in said sheets are of differing sizes such that a flow rate of said first fluid through said tubes is substantially uniform.

23. The heat exchanger of claim 1, wherein at least one of the first and third sections is comprised of two or more sheets laminated to one another each sheet having a same arrangement of one or more openings therethrough, and wherein each of the first, second and third sections forms a different arrangement of portions of the fluid flow path.

24. The heat exchanger of claim 1, wherein each of the first and third sections is comprised of two or more sheets laminated to one another, and wherein at least two sheets in each of the first and third sections have a same arrangement of one or more openings therethrough, the arrangement in the first section being different from the arrangement in the third section.

25. The heat exchanger system of claim 18, at least one of the first and second manifolds further comprising wherein at least one of the first and third sections is comprised of two or more sheets laminated to one another each sheet having a same arrangement of one or more openings therethrough, and wherein each of the first, second and third sections forms a different arrangement of portions of the fluid flow path.

26. The heat exchanger system of claim 18, at least one of the first and second manifolds further comprising wherein each of the first and third sections is comprised of two or more sheets laminated to one another, and wherein at least two sheets in each of the first and third sections have a same arrangement of one or more openings therethrough, the arrangement in the first section being different from the arrangement in the third section.

* * * * *